(12) United States Patent
Servalli et al.

(10) Patent No.: US 12,004,338 B2
(45) Date of Patent: Jun. 4, 2024

(54) MEMORY DEVICE HAVING A DIAGONALLY OPPOSITE GATE PAIR PER MEMORY CELL

(71) Applicant: Micron Technology, Inc., Boise, ID (US)

(72) Inventors: Giorgio Servalli, Fara Gera d'Adda (IT); Marcello Mariani, Milan (IT); Antonino Rigano, Cernusco sul Naviglio (IT); Marcello Calabrese, Monza (IT)

(73) Assignee: Micron Technology, Inc., Boise, ID (US)

( * ) Notice: Subject to any disclaimer, the term of this patent is extended or adjusted under 35 U.S.C. 154(b) by 94 days.

(21) Appl. No.: 17/645,348

(22) Filed: Dec. 21, 2021

(65) Prior Publication Data
US 2023/0200048 A1 Jun. 22, 2023

(51) Int. Cl.
*H10B 12/00* (2023.01)
*H01L 25/065* (2023.01)

(52) U.S. Cl.
CPC ......... *H10B 12/30* (2023.02); *H01L 25/0655* (2013.01); *H10B 12/033* (2023.02); *H10B 12/48* (2023.02)

(58) Field of Classification Search
CPC ... H01L 25/0655; H10B 12/30; H10B 12/033; H10B 12/48
See application file for complete search history.

(56) References Cited

U.S. PATENT DOCUMENTS

| | | | |
|---|---|---|---|
| 2010/0112753 A1* | 5/2010 | Lee | H01L 24/29 257/E21.705 |
| 2020/0220023 A1* | 7/2020 | Pillarisetty | H01L 21/2255 |

* cited by examiner

*Primary Examiner* — Nicholas J Tobergte
*Assistant Examiner* — Kevin Quinto
(74) *Attorney, Agent, or Firm* — Harrity & Harrity, LLP

(57) ABSTRACT

Implementations described herein relate to various structures, integrated assemblies, and memory devices. In some implementations, an integrated assembly includes a pillar having an upper source/drain, a middle source/drain, a lower source/drain, an upper channel between the upper source/drain and the middle source/drain, and a lower channel between the middle source/drain and the lower source/drain. The integrated assembly includes a gate pair that includes a first gate and a second gate. The first gate is positioned on a first side of the pillar at a first height, and the second gate is positioned on a second side of the pillar, that is opposite the first side, at a second height that is different from the first height. The integrated assembly includes a capacitor that is electrically coupled with the upper source/drain. Some implementations include methods of forming the various structures, integrated assemblies, and memory devices.

25 Claims, 17 Drawing Sheets

400

410 — Form a structure that includes a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction; an upper gate proximate to the upper channel, wherein the right-facing vertical surface faces the upper gate; a lower gate proximate to the lower channel, wherein the left-facing vertical surface faces the lower gate; an electrical contact region coupled with the upper source/drain; and an electrical line that is beneath the pillar and that is electrically coupled with the lower source/drain 420 — Electrically couple the upper gate and the lower gate

MEMORY DEVICE HAVING A DIAGONALLY OPPOSITE GATE PAIR PER MEMORY CELL

TECHNICAL FIELD

The present disclosure generally relates to semiconductor devices and methods of forming semiconductor devices and, for example, to a memory device having a diagonally opposite gate pair per memory cell and a method of forming the memory device.

BACKGROUND

A memory device includes memory cells. A memory cell is an electronic circuit capable of being set to a data state of two or more data states. For example, a memory cell may be set to a data state that represents a single binary value (a 1 or a 0). As another example, a memory cell may be set to a data state that represents a fractional value (e.g., 0.5, 1.5, or the like). In a dynamic random access memory (DRAM) memory cell, a value is stored using a capacitor, which is an electronic component that can store electric charge. A charged capacitor may represent a first data state (and a corresponding first value, such as a 1), and a discharged capacitor may represent a second data state (and a corresponding second value, such as a 0). In some cases, more than two data states may be stored using various levels of charge of the capacitor. A transistor in the DRAM memory cell includes a gate that at any given time either blocks a flow of current to or from the capacitor, or allows current to flow to or from the capacitor. A value may be written to or read from the capacitor by allowing current to flow to or from the capacitor. A value may be stored in the capacitor (e.g., for later reading) by charging the capacitor (to represent a first data state, such as a binary 1) or discharging the capacitor (to represent a second data state, such as a binary 0) and blocking the flow of current to or from the capacitor.

BRIEF DESCRIPTION OF THE DRAWINGS

FIG. 1A is a top view, FIG. 1B is a cross-sectional view along the line 1B-1B of FIG. 1A, and FIG. 1C is a cross-sectional view along the line 1C-1C of FIG. 1A.

FIG. 4 is a flowchart of an example method of forming an integrated assembly having a diagonally opposite gate pair per memory cell.

FIG. 5A is a cross-sectional view along the line 1B-1B of FIG. 1A at the example process stage of FIGS. 5A-5B, and FIG. 5B is a cross-sectional view along the line 1C-1C of FIG. 1A at the example process stage of FIGS. 5A-5B.

FIG. 6A is a cross-sectional view along the line 1B-1B of FIG. 1A at the example process stage of FIGS.

2

Figure 1A:
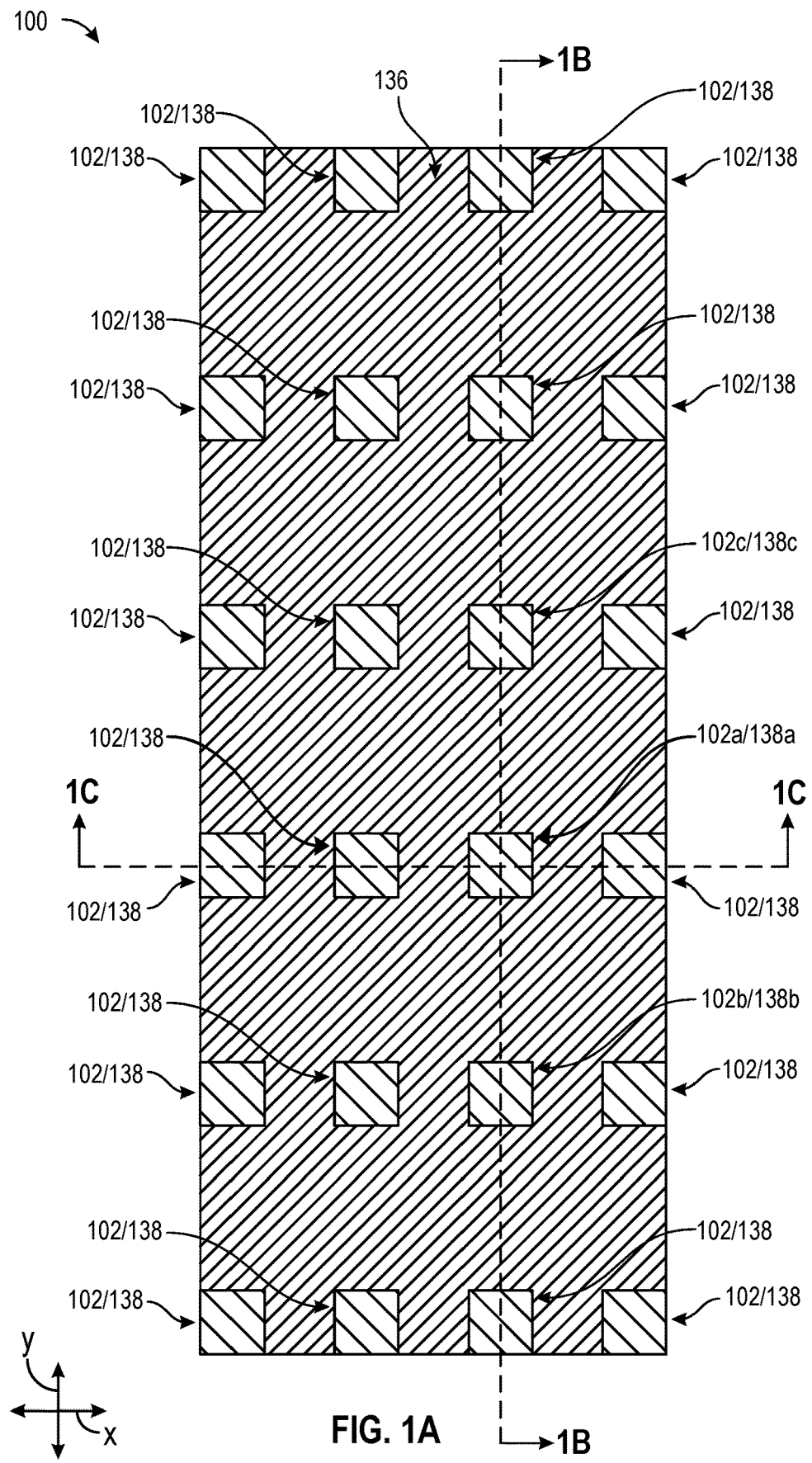
FIGS. 1A-1C are diagrammatic views of an example structure having a diagonally opposite gate pair per memory cell.
Figure 6A:
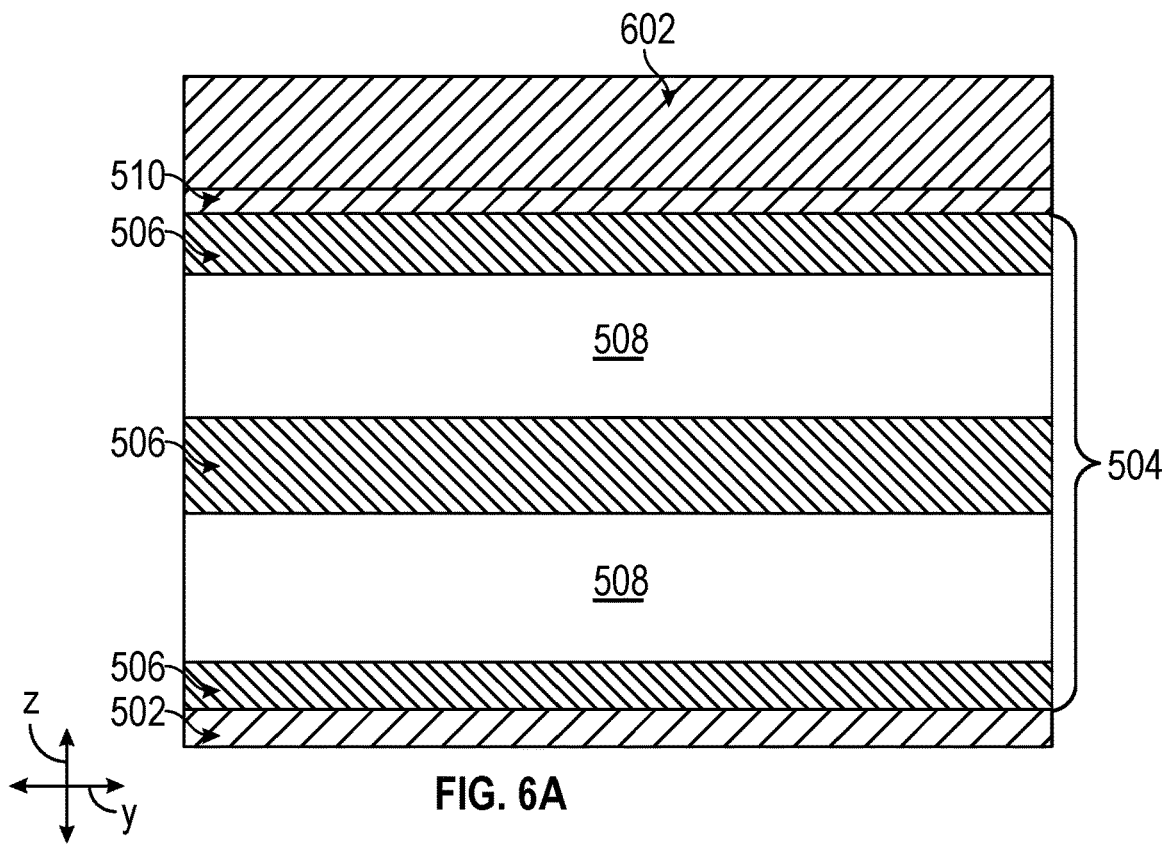
FIGS. 6A and 6B are diagrammatic views showing formation of the structure of FIGS. 1A-1C at an example process stage that is after the example process stage of FIGS. 5A and 5B.
Figure 6B:
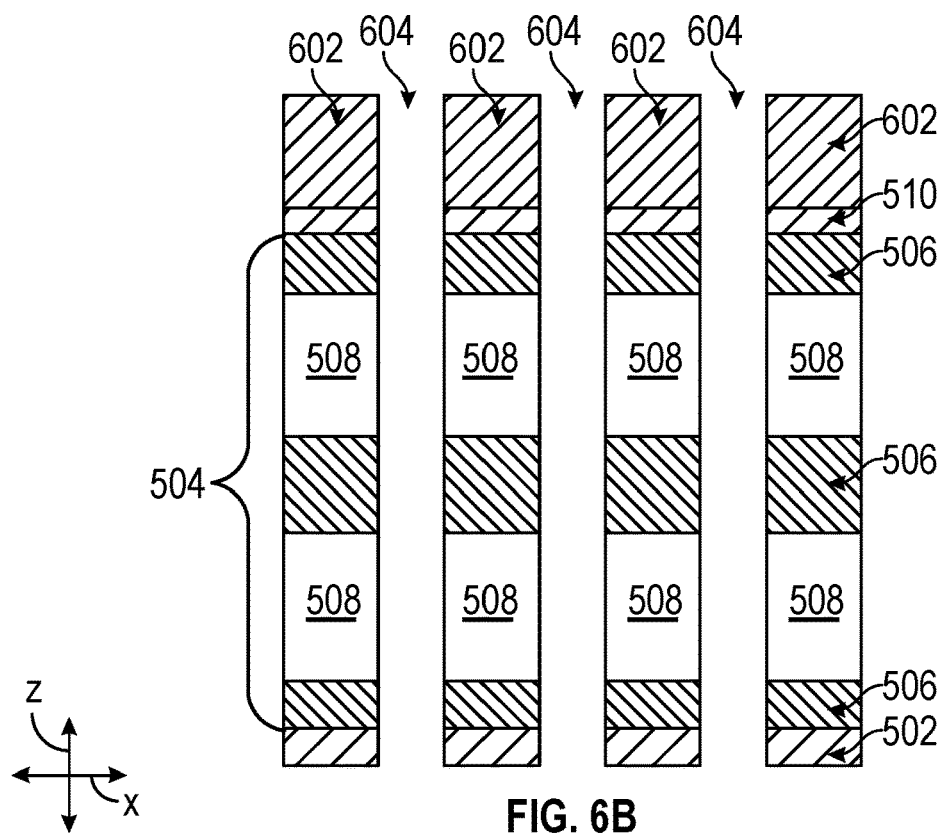

6A-6B, and FIG. 6B is a cross-sectional view along the line 1C-1C of FIG. 1A at the example process stage of FIGS. 6A-6B.

Figure 1B:
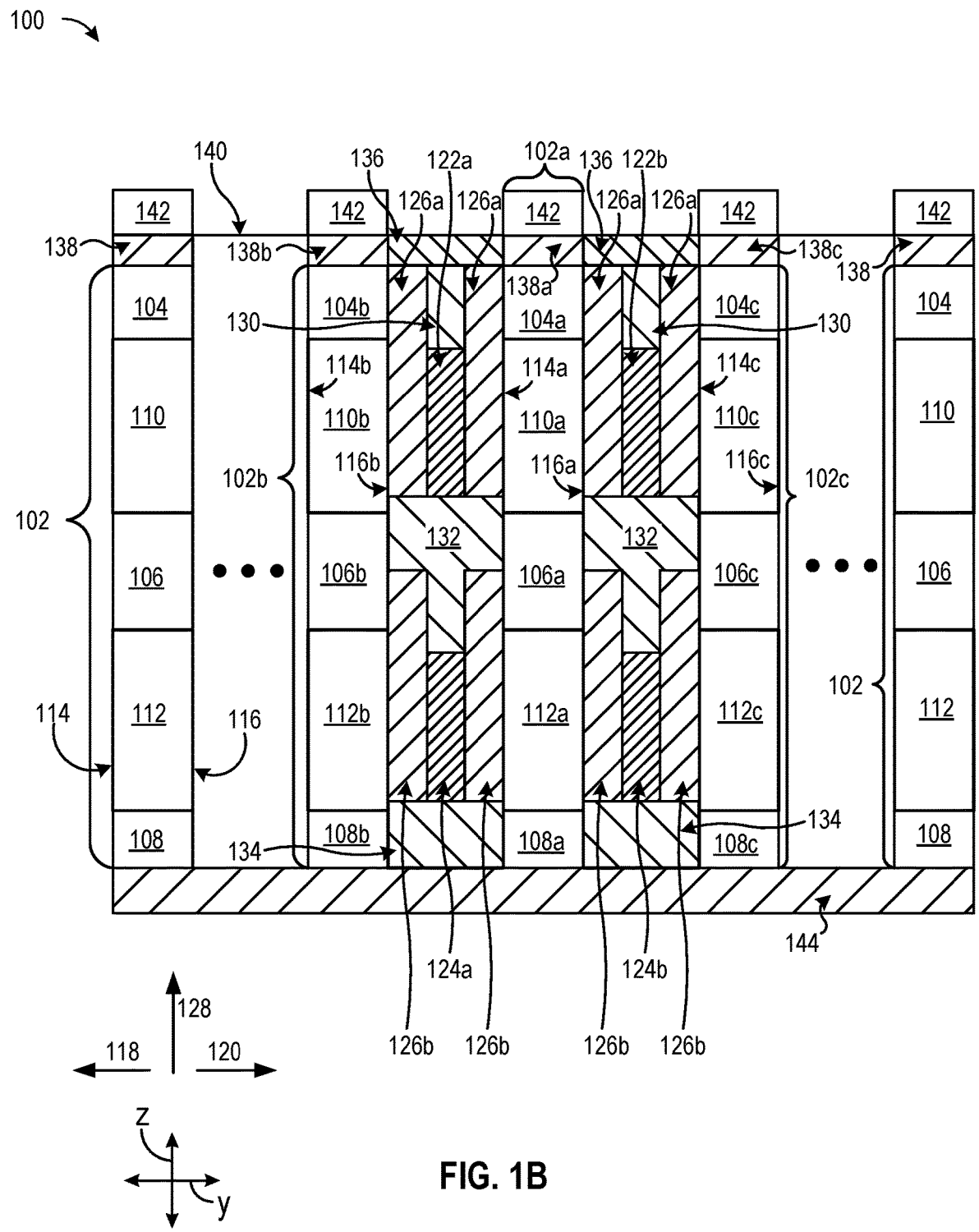
Figure 1C:
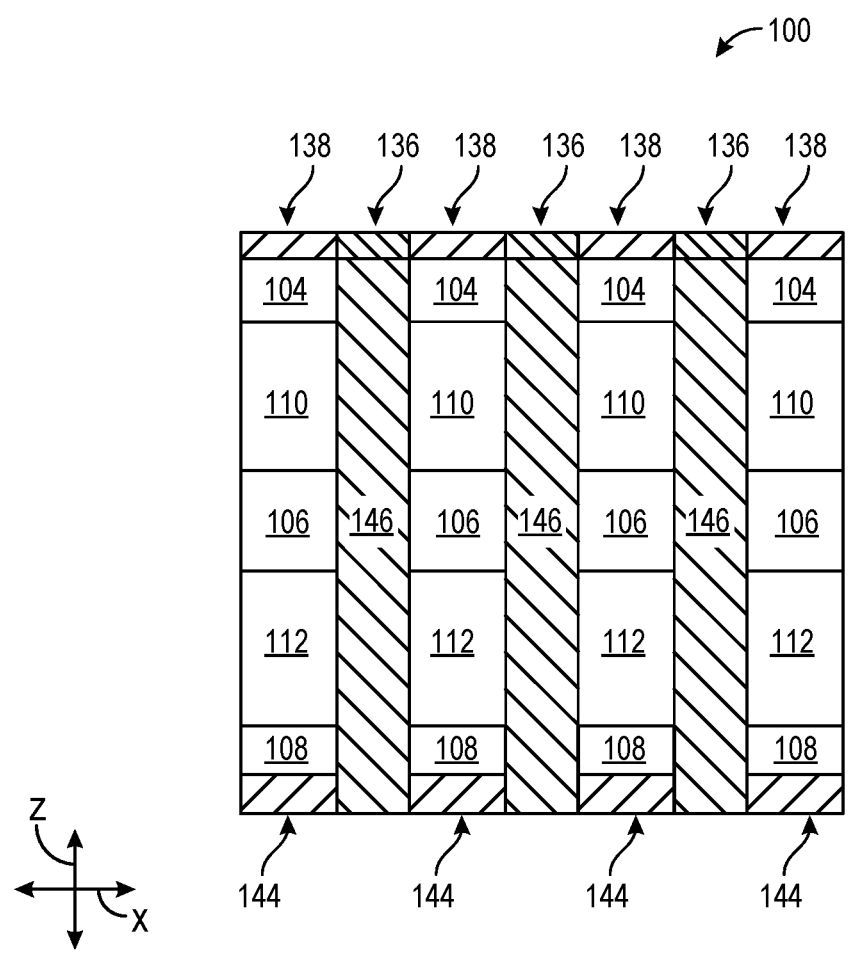
Figure 7A:
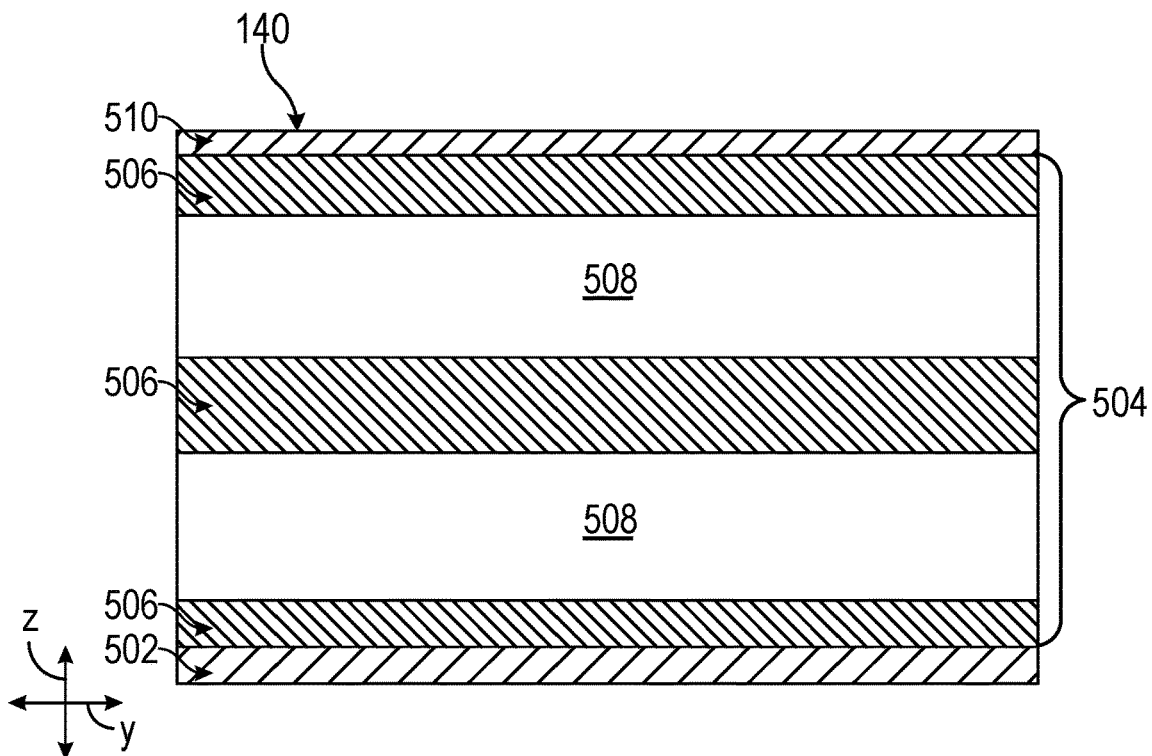
Figure 7B:
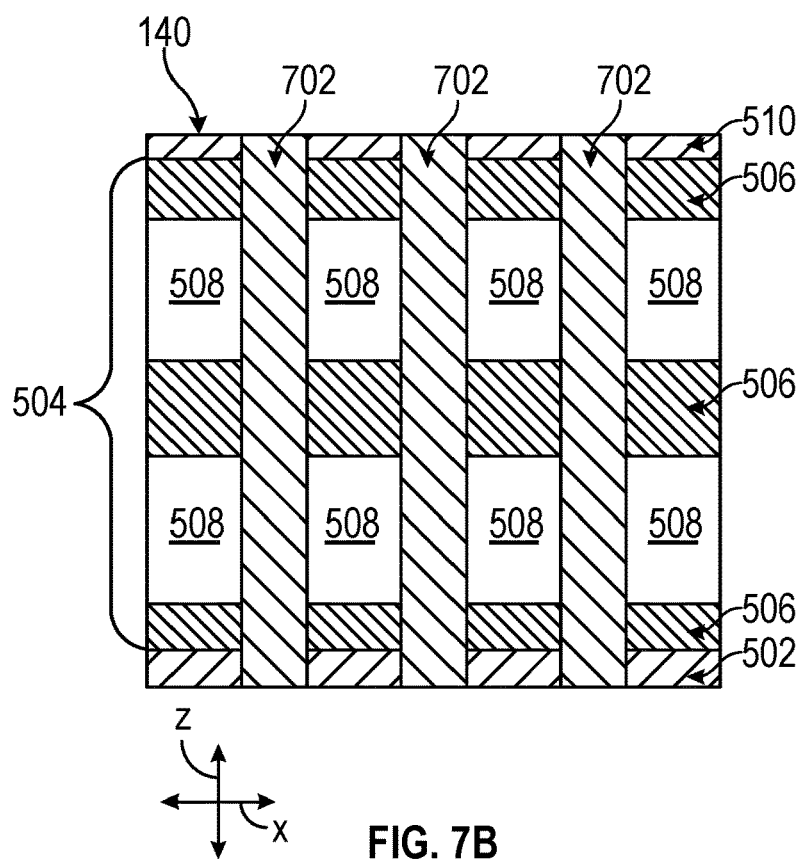

FIGS. 7A and 7B are diagrammatic views showing formation of the structure of FIGS. 1A-1C at an example process stage that is after the example process stage of FIGS. 6A and 6B. FIG. 7A is a cross-sectional view along the line 1B-1B of FIG. 1A at the example process stage of FIGS. 7A-7B, and FIG. 7B is a cross-sectional view along the line 1C-1C of FIG. 1A at the example process stage of FIGS. 7A-7B.

Figure 8A:
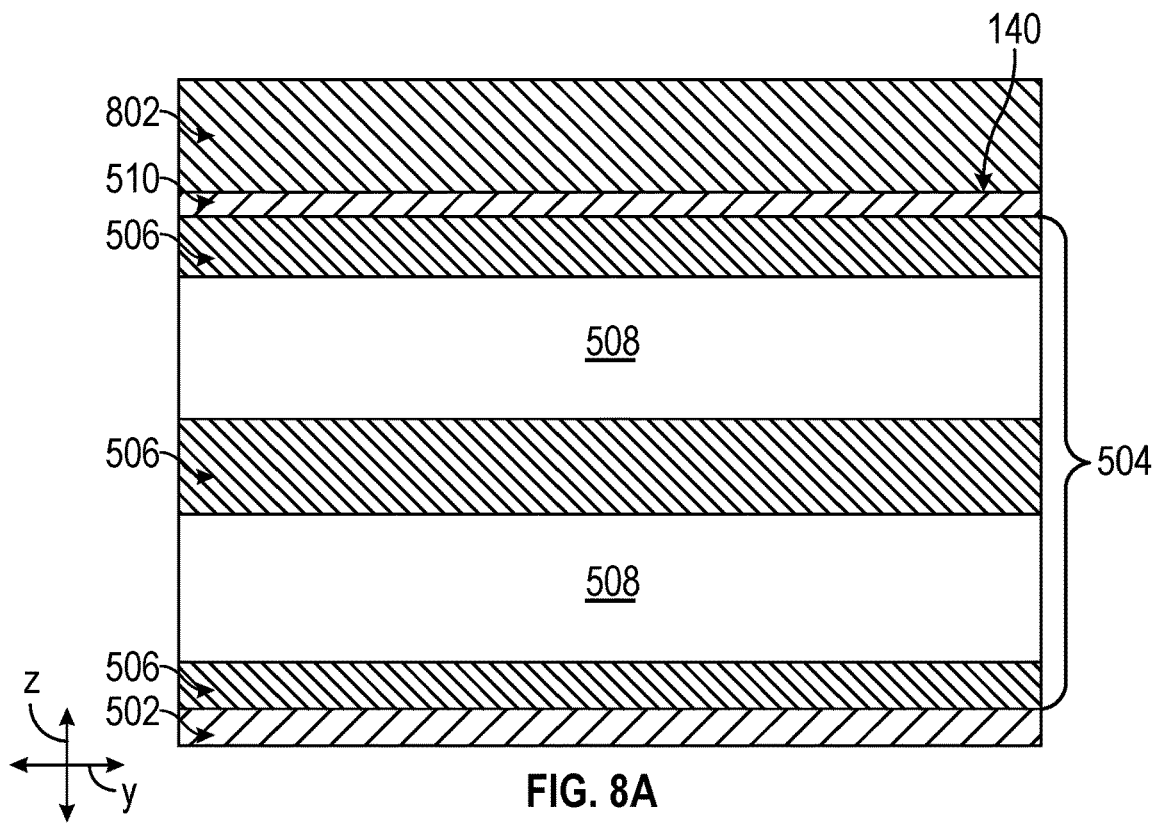
Figure 8B:
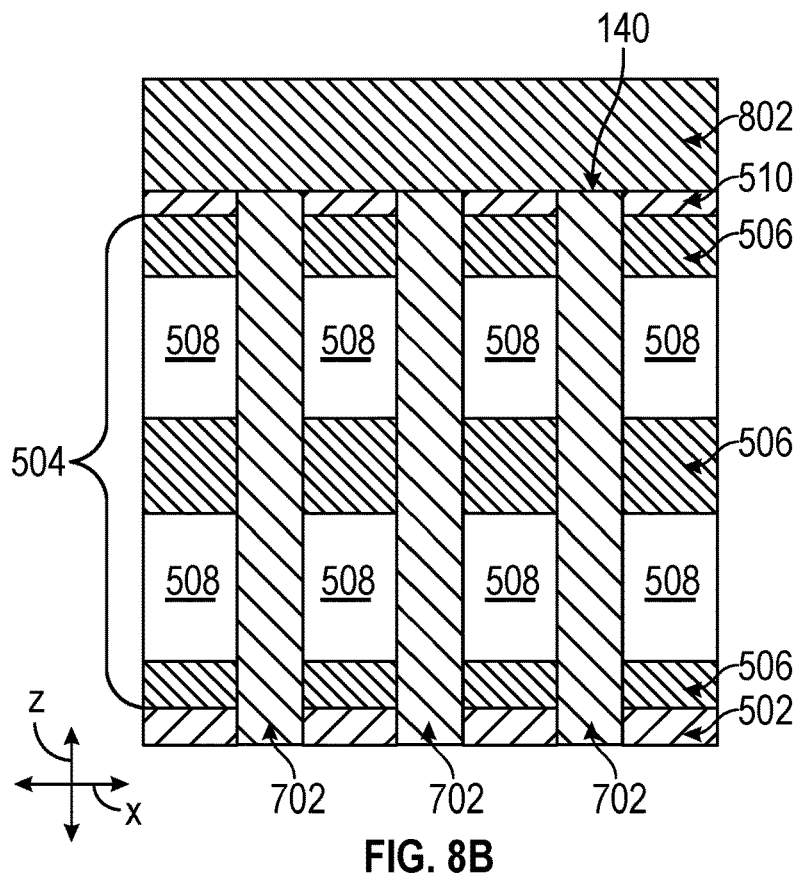

FIGS. 8A and 8B are diagrammatic views showing formation of the structure of FIGS. 1A-1C at an example process stage that is after the example process stage of FIGS. 7A and 7B. FIG. 8A is a cross-sectional view along the line 1B-1B of FIG. 1A at the example process stage of FIGS. 8A-8B, and FIG. 8B is a cross-sectional view along the line 1C-1C of FIG. 1A at the example process stage of FIGS. 8A-8B.

Figure 9A:
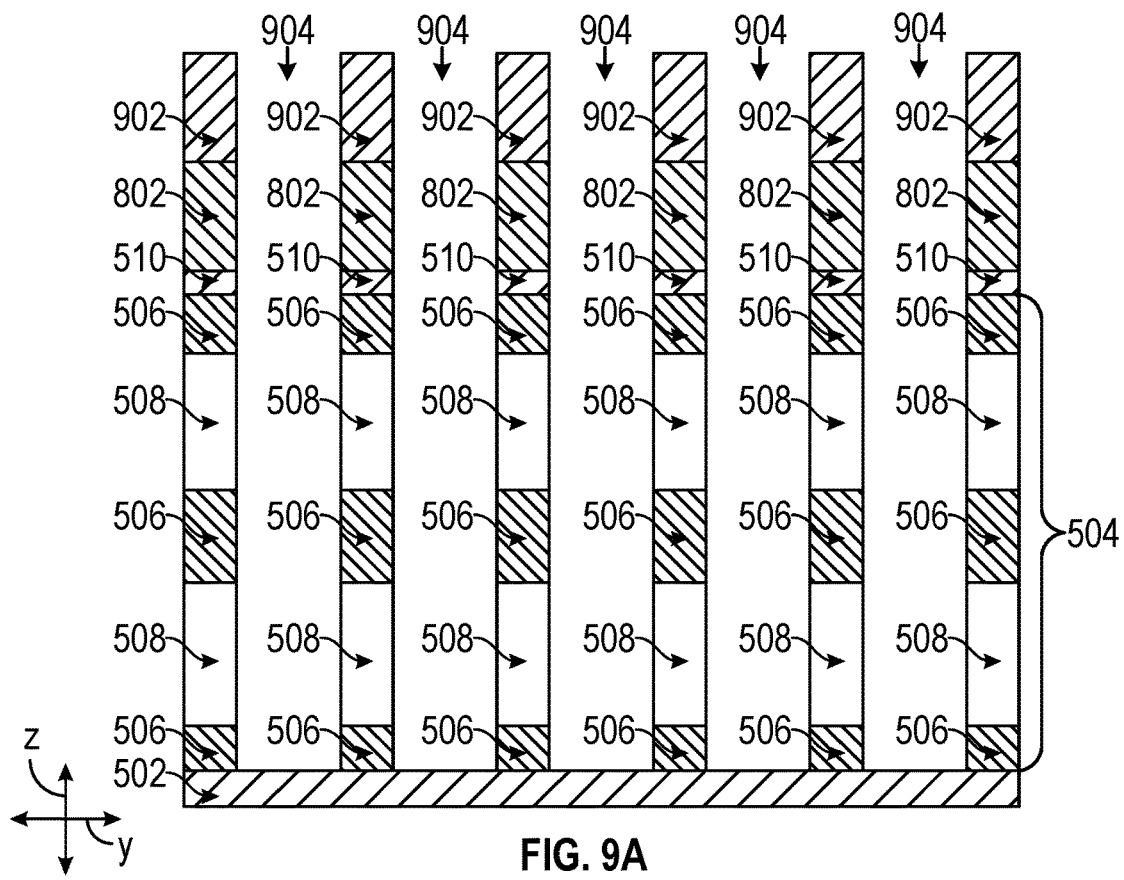
Figure 9B:
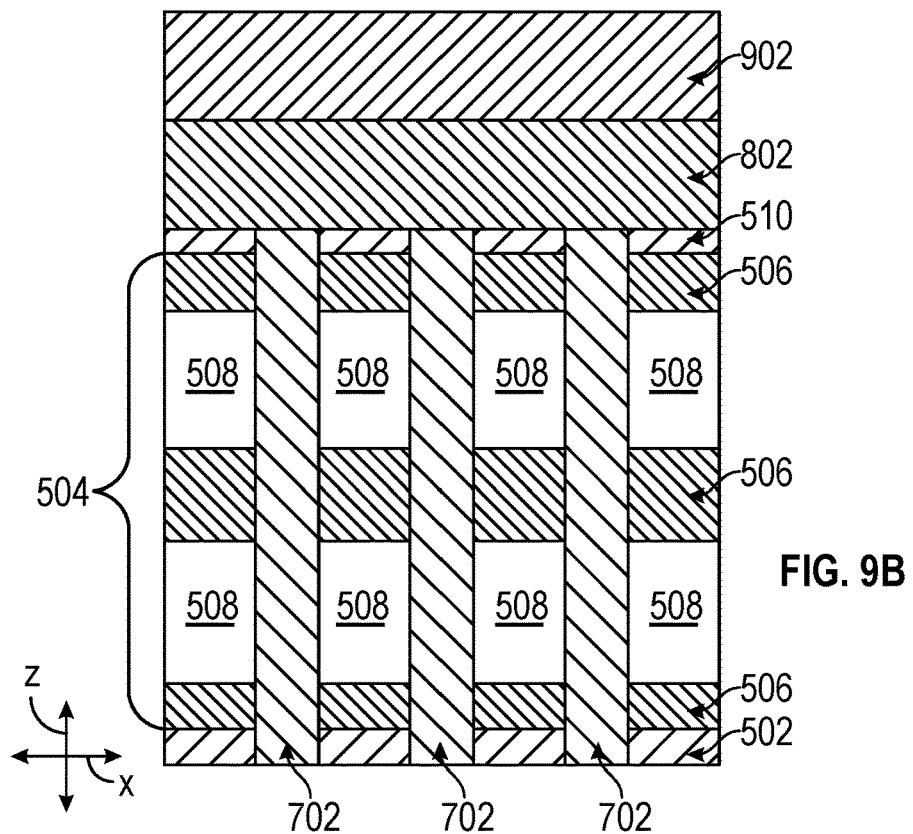

FIGS. 9A and 9B are diagrammatic views showing formation of the structure of FIGS. 1A-1C at an example process stage that is after the example process stage of FIGS. 8A and 8B. FIG. 9A is a cross-sectional view along the line 1B-1B of FIG. 1A at the example process stage of FIGS. 9A-9B, and FIG. 9B is a cross-sectional view along the line 1C-1C of FIG. 1A at the example process stage of FIGS. 9A-9B.

Figure 10A:
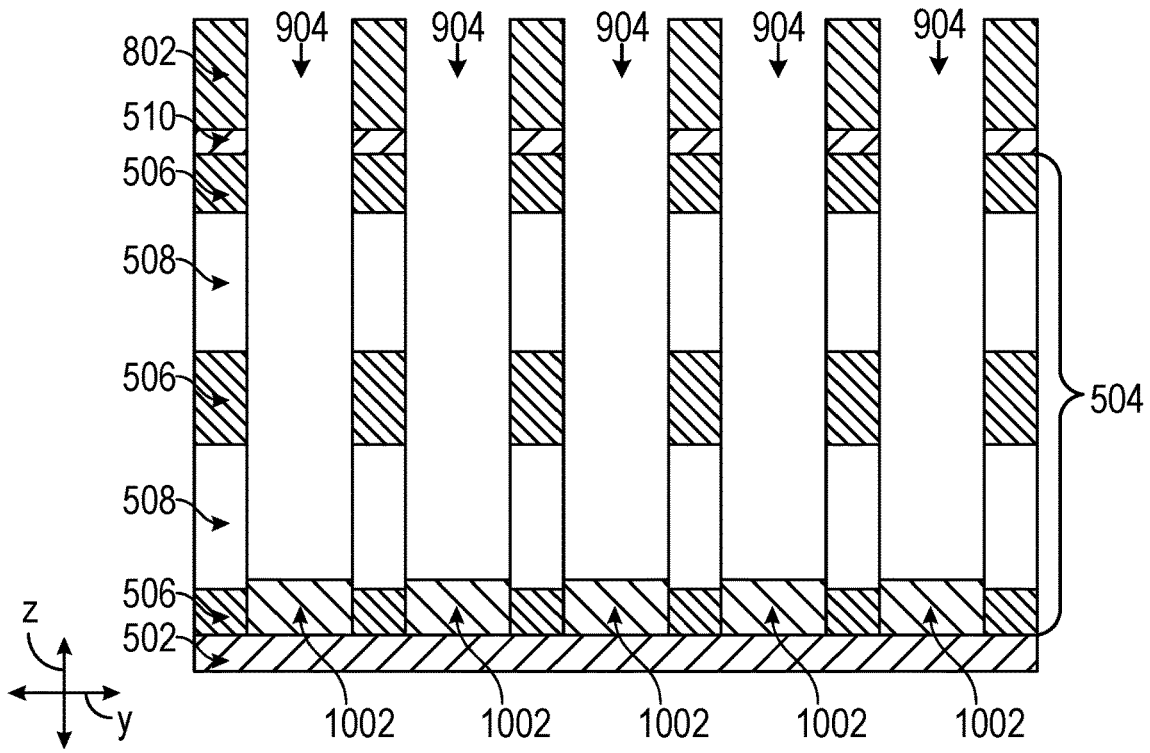
Figure 10B:
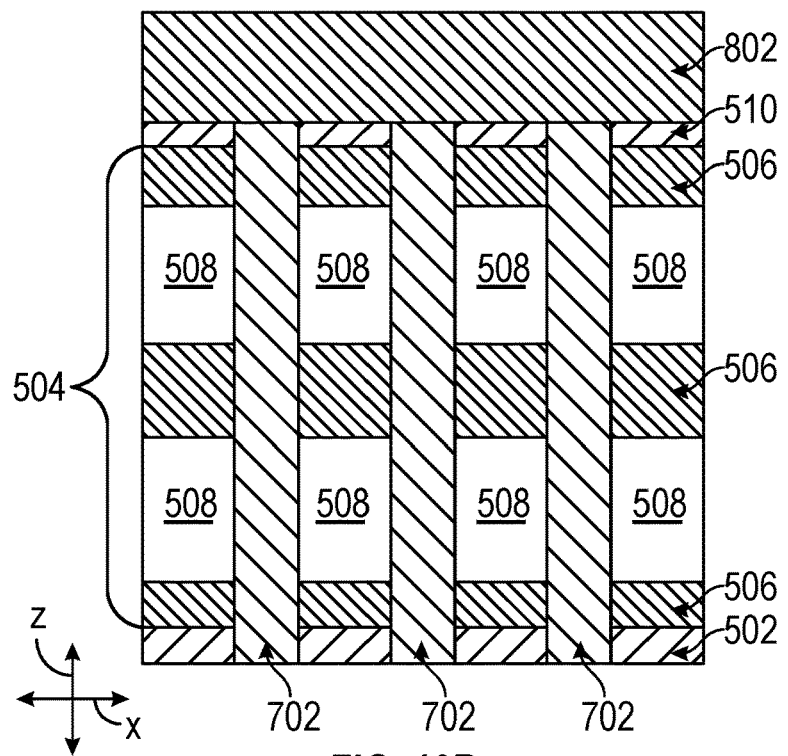

FIGS. 10A and 10B are diagrammatic views showing formation of the structure of FIGS. 1A-1C at an example process stage that is after the example process stage of FIGS. 9A and 9B. FIG. 10A is a cross-sectional view along the line 1B-1B of FIG. 1A at the example process stage of FIGS. 10A-10B, and FIG. 10B is a cross-sectional view along the line 1C-1C of FIG. 1A at the example process stage of FIGS. 10A-10B.

Figure 11A:
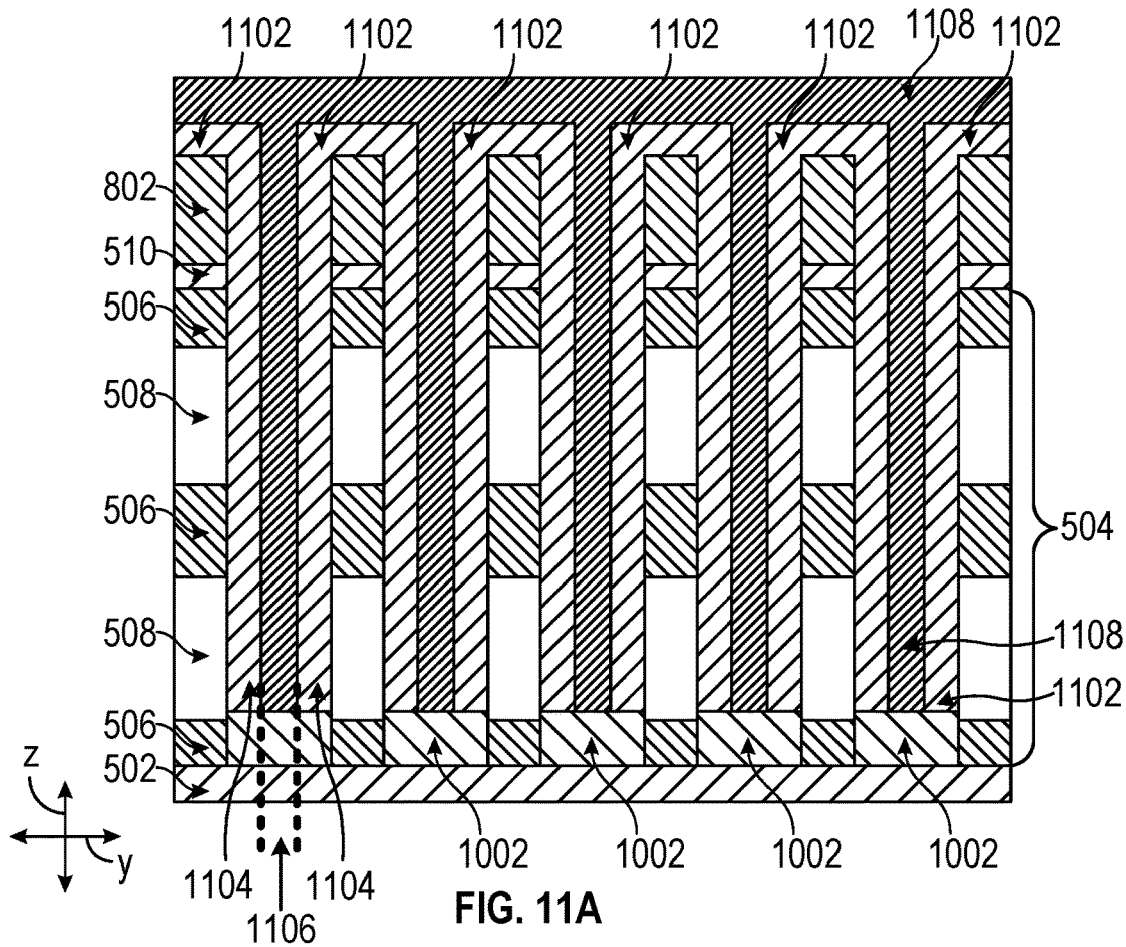
Figure 11B:
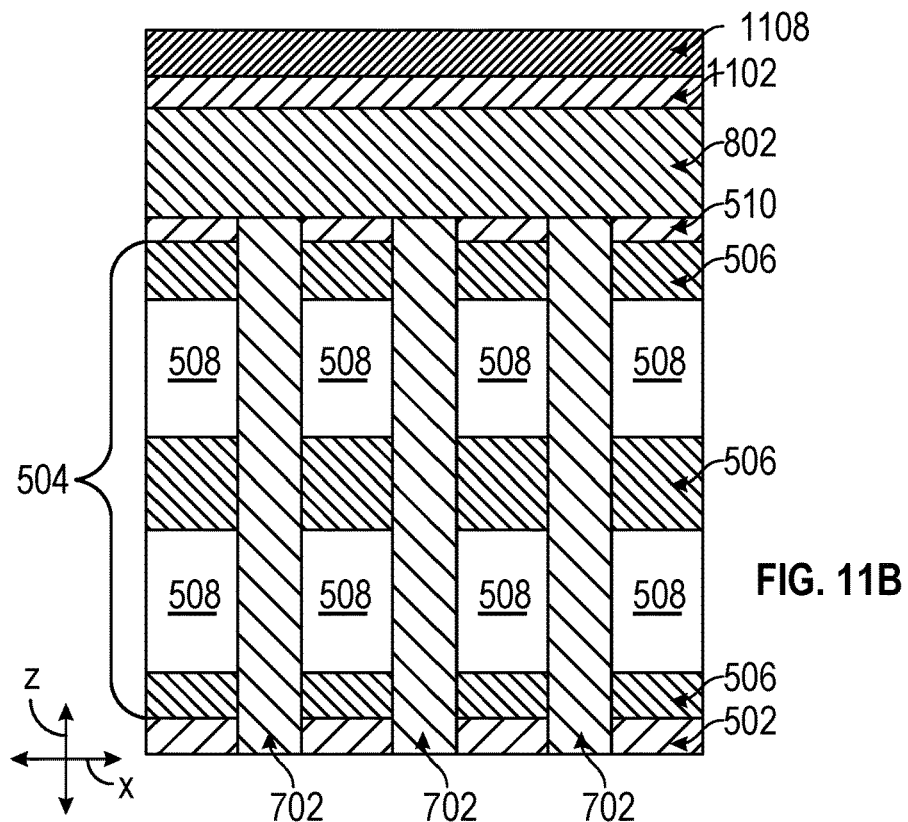

FIGS. 11A and 11B are diagrammatic views showing formation of the structure of FIGS. 1A-1C at an example process stage that is after the example process stage of FIGS. 10A and 10B. FIG. 11A is a cross-sectional view along the line 1B-1B of FIG. 1A at the example process stage of FIGS. 11A-11B, and FIG. 11B is a cross-sectional view along the line 1C-1C of FIG. 1A at the example process stage of FIGS. 11A-11B.

Figure 12A:
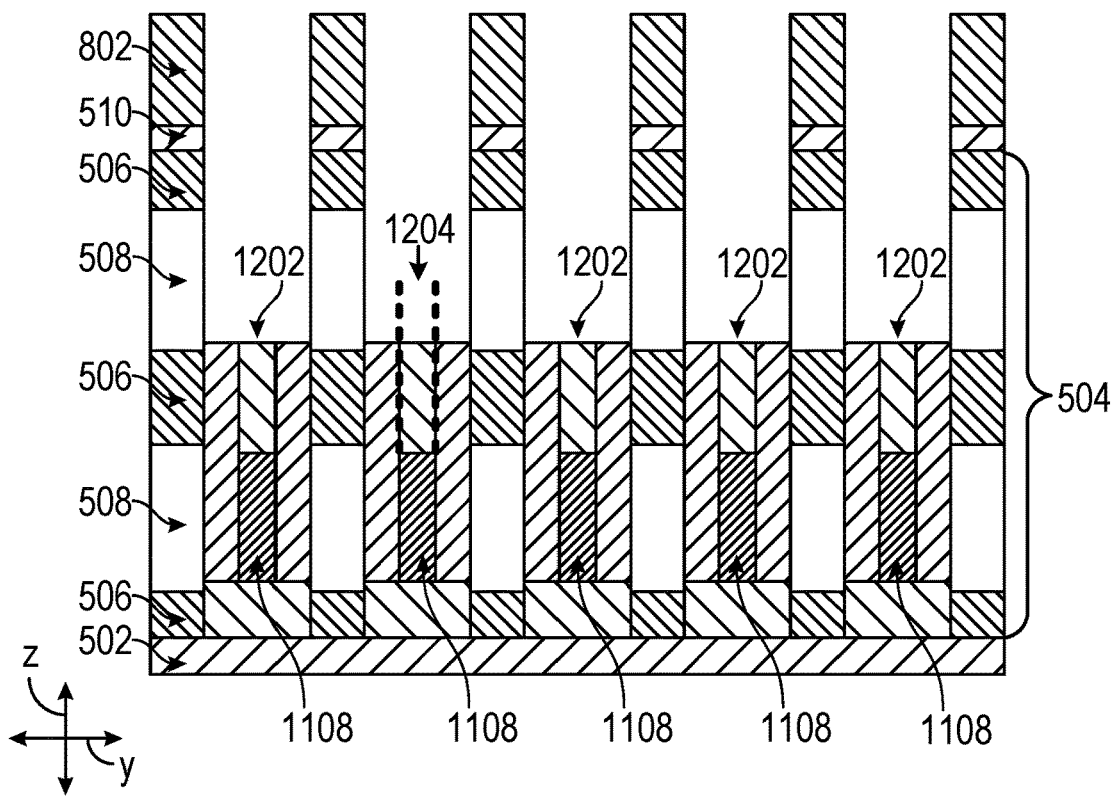
Figure 12B:
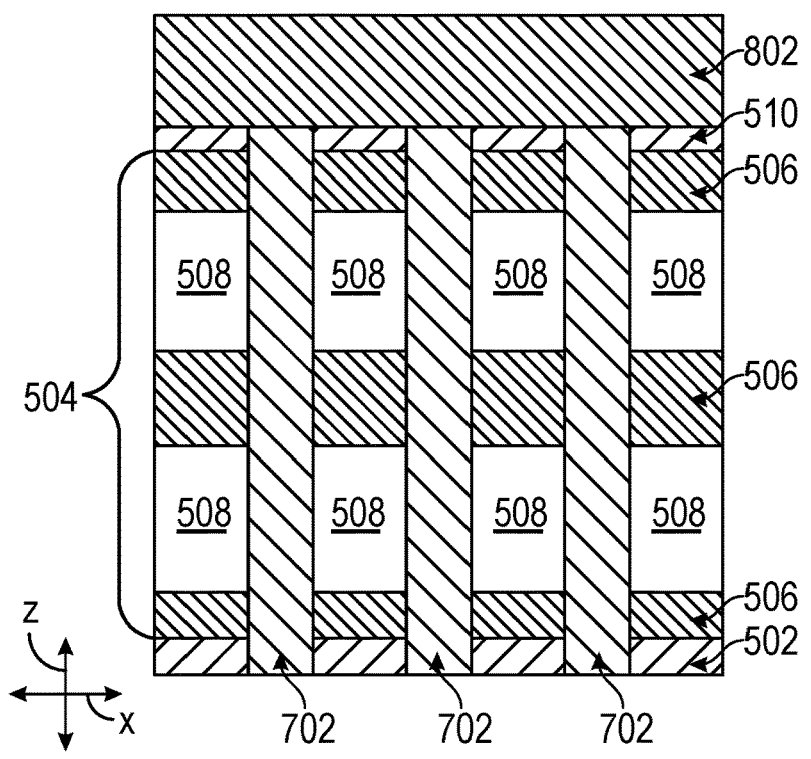

FIGS. 12A and 12B are diagrammatic views showing formation of the structure of FIGS. 1A-1C at an example process stage that is after the example process stage of FIGS. 11A and 11B. FIG. 12A is a cross-sectional view along the line 1B-1B of FIG. 1A at the example process stage of FIGS. 12A-12B, and FIG. 12B is a cross-sectional view along the line 1C-1C of FIG. 1A at the example process stage of FIGS. 12A-12B.

Figure 13A:
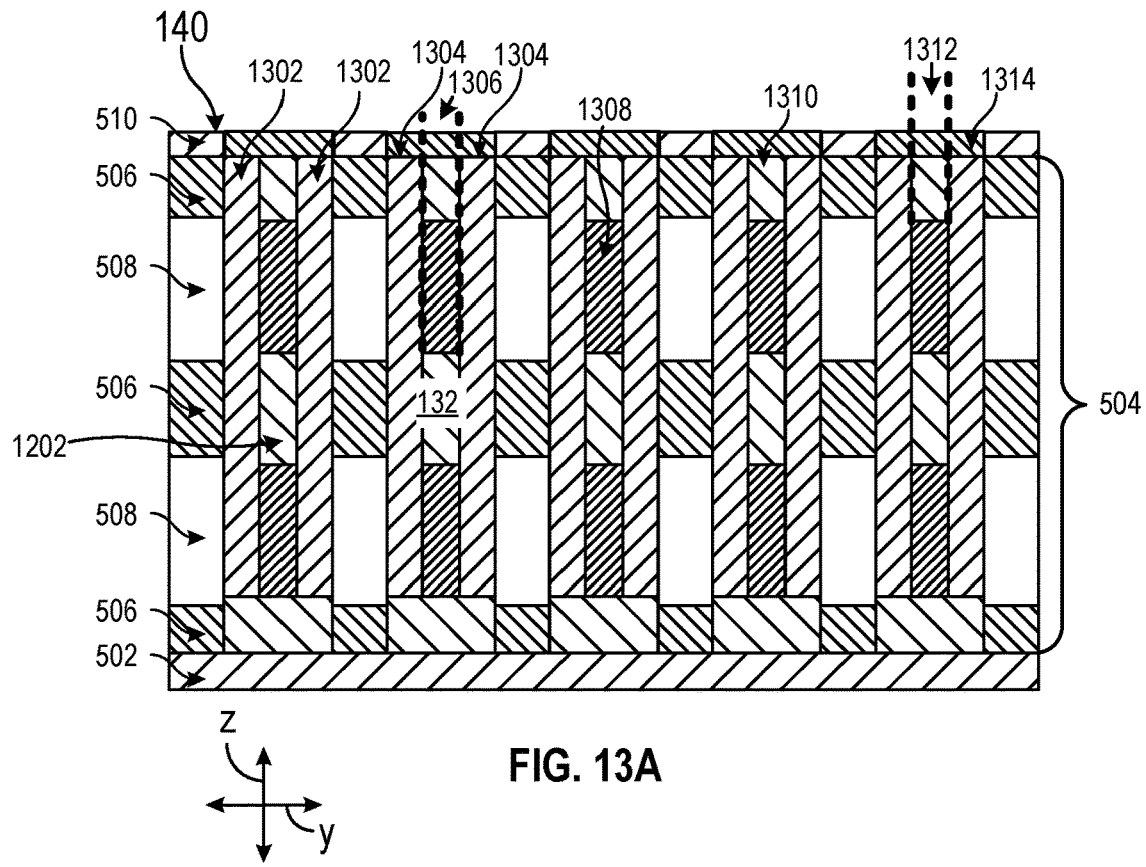
Figure 13B:
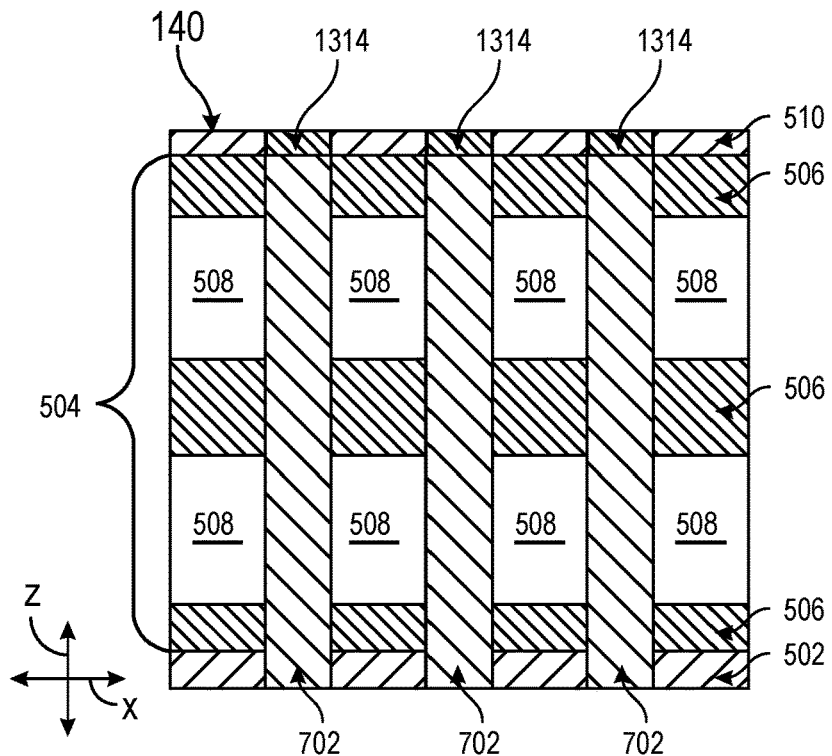

FIGS. 13A and 13B are diagrammatic views showing formation of the structure of FIGS. 1A-1C at an example process stage that is after the example process stage of FIGS. 12A and 12B. FIG. 13A is a cross-sectional view along the line 1B-1B of FIG. 1A at the example process stage of FIGS. 13A-13B, and FIG. 13B is a cross-sectional view along the line 1C-1C of FIG. 1A at the example process stage of FIGS. 13A-13B.

Figure 14:
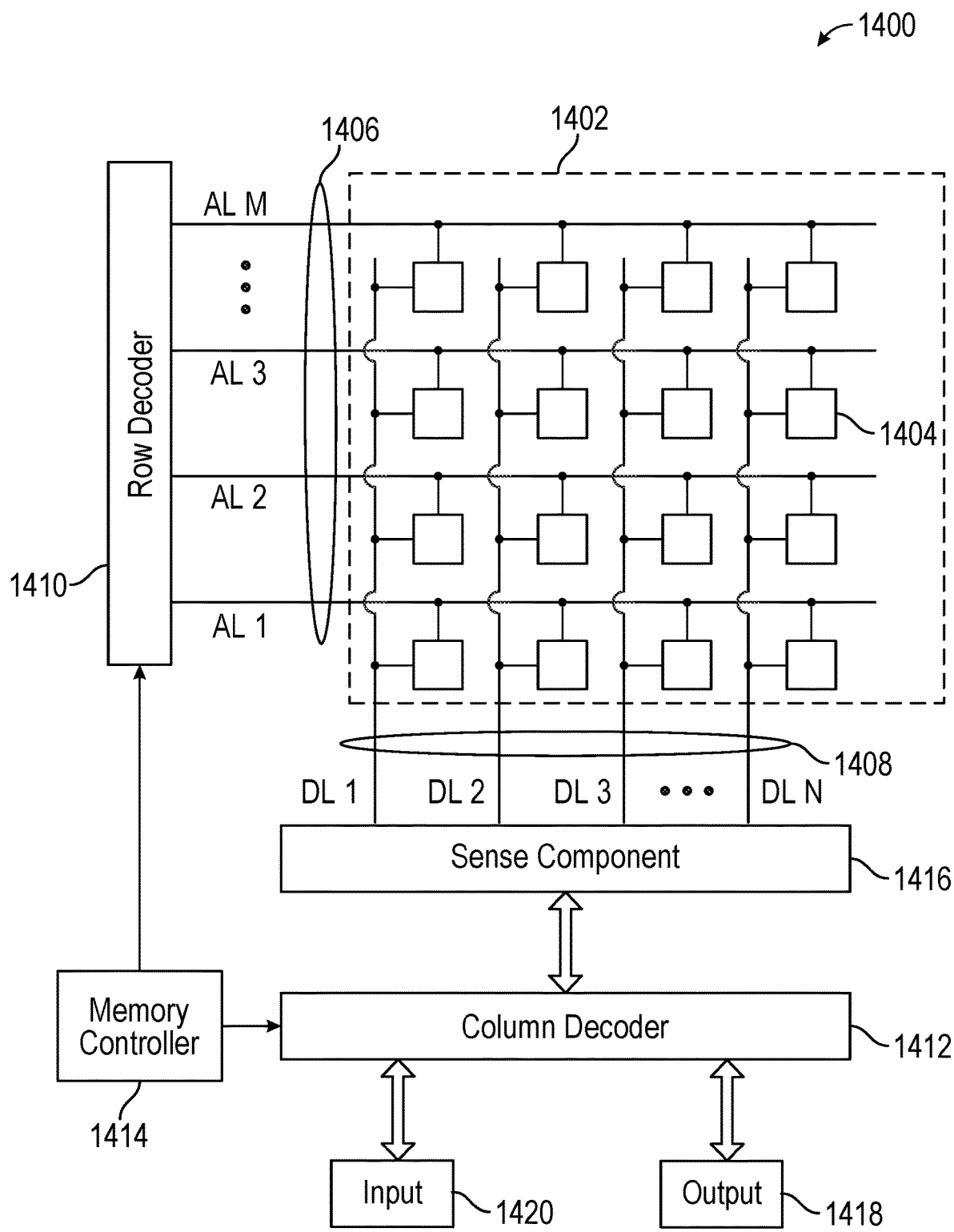

FIG. 14 is a diagrammatic view of an example memory device that includes the structure of FIGS. 1A-1C.

Figure 15:
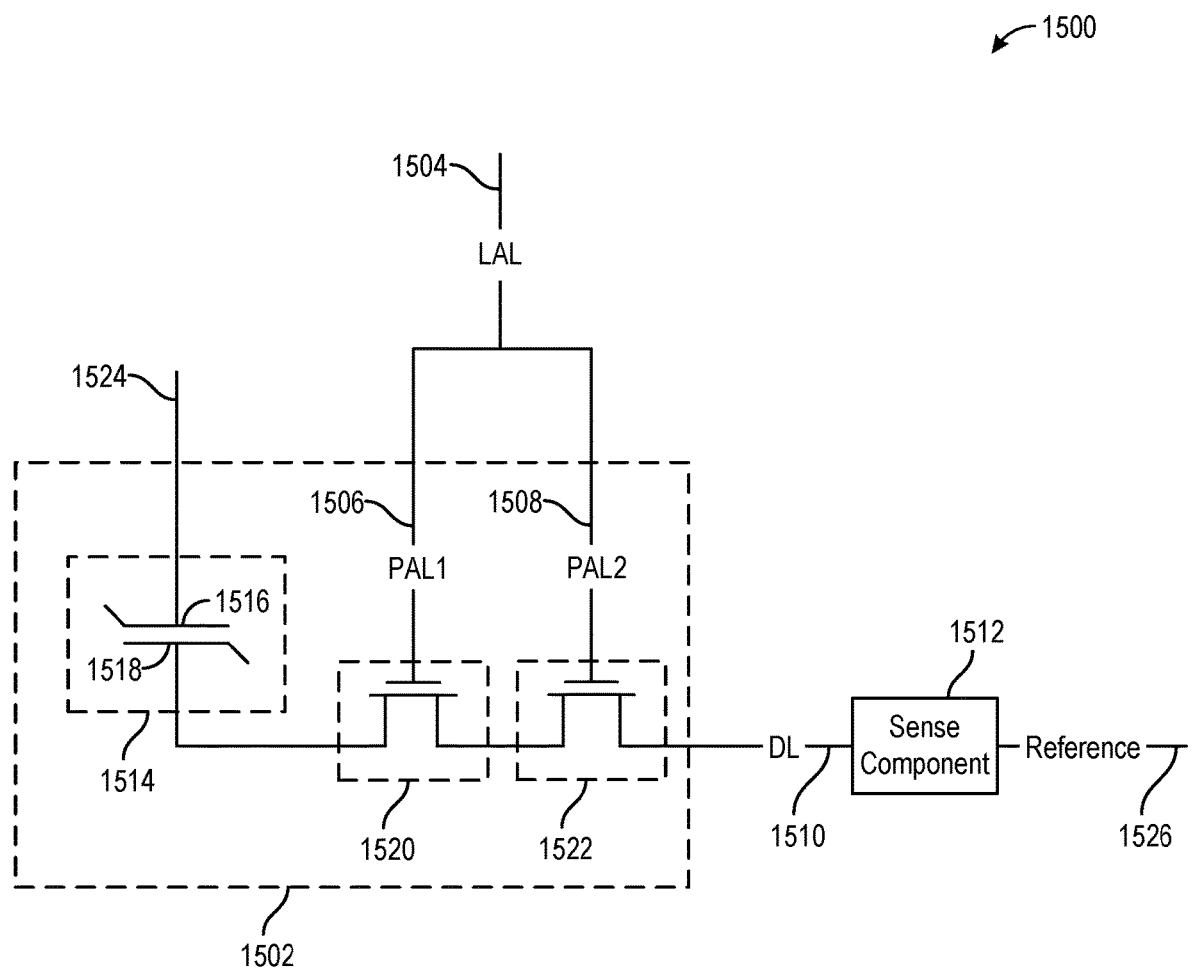

FIG. 15 is a diagrammatic view of an example circuit of a memory cell included in the memory device of FIG. 14.

DETAILED DESCRIPTION

A typical DRAM memory cell includes a single capacitor and a single transistor that is used to access the DRAM memory cell to read or write data to the DRAM memory cell (e.g., by charging or discharging the capacitor to store a value, such as a 1 or a 0, or by charging or discharging the capacitor to a particular level to represent a data state of two or more data states). In DRAM memory arrays with a single transistor (e.g., a thin film transistor, or TFT) per memory cell, a gate of the transistor may be positioned between a first pillar and a second pillar. Each pillar may include a source, a drain, and a channel (e.g., a junction) that connects the source and the drain, and each pillar may couple a corresponding capacitor to a digit line (sometimes called a "bit line" or a "column line"). In this arrangement, the gate of the transistor must be close enough to the first pillar to enable current to flow through the first pillar when the transistor is activated (e.g., by applying a voltage to the gate), and must be far enough from the second pillar such that current does not flow through the second pillar when the transistor is activated. If the gate is close to both pillars, then current would flow through both pillars when the transistor is activated. As a result, an individual memory cell would not be uniquely addressable (or uniquely accessible) because activation of a single transistor would result in accessing two memory cells, rather than one.

To allow a single transistor (e.g., in combination with a digit line) to uniquely address a single memory cell, the gate of the transistor may be positioned close to the first pillar and a sufficient distance away from the second pillar. However, this increases a pitch (e.g., a spacing between consecutive memory cells), which reduces the number of memory cells that can be formed in a given area, increases a die size, and reduces the number of dies that can be manufactured from a wafer of a given size.

Implementations described herein use two transistors (e.g., two TFTs) to access a single memory cell. The respective gates of the two transistors may be positioned on opposite sides of a pillar, and may be positioned at different heights of the pillar, such that one of the gates controls the flow of current through a first portion (e.g., a first channel) of the pillar and the other gate controls the flow of current through a second portion (e.g., a second channel) of the pillar. This arrangement of the gates is sometimes called a "diagonally opposite gate pair" herein, and is described in more detail below. If both gates are not activated (e.g., if neither of the gates or only one of the gates is activated), then current does not flow through the pillar. If both gates are activated, then current flows through the pillar. As a result, a single memory cell is uniquely addressable (and uniquely accessible) by a digit line and two transistors having gates that are electrically coupled to form a logical access line. This arrangement increases the number of memory cells that can be formed in a given area, decreases a die size, and increases the number of dies that can be manufactured from a wafer of a given size.

FIGS. 1A-1C are diagrammatic views of an example structure 100 having a diagonally opposite gate pair per memory cell. The structure 100 may be part of an integrated assembly, such as a memory array, a portion of a memory array, or a memory device that includes the memory array and one or more other components (e.g., sense amplifiers, a row decoder, a column decoder, a row address buffer, a column address buffer, one or more data buffers, one or more clocks, one or more counters, and/or a memory controller).

As shown in FIGS. 1A-1C, the structure 100 includes multiple pillars 102. A pillar 102 may include an upper source/drain 104, a middle source/drain 106, a lower source/drain 108, an upper channel 110 between the upper source/drain 104 and the middle source/drain 106, and a lower channel 112 between the middle source/drain 106 and the lower source/drain 108. As shown, the upper source/drain 104 is at or on the top of the pillar 102, and the lower source/drain 108 is at or on the bottom of the pillar 102. The upper channel 110 (sometimes called an "upper junction") is beneath and/or abutting the upper source/drain 104 and is above and/or abutting the middle source/drain 106. The lower channel 112 (sometimes called a "lower junction") is beneath and/or abutting the middle source/drain 106 and is above and/or abutting the lower source/drain 108. The term "source/drain" is explained below in connection with FIG. 2.

In FIGS. 1A-1C, three of the pillars 102 are labeled as a first pillar 102a, a second pillar 102b, and a third pillar 102c to distinguish these pillars from one another and from the other pillars 102. A pillar 102 may include a left-facing vertical surface 114 and a right-facing vertical surface 116. The left-facing vertical surface 114 faces a first direction 118, and the right-facing vertical surface 116 faces a second direction 120 that is opposite the first direction 118. The first direction 118 and the second direction 120 are opposite directions along the illustrated y-axis.

A left-facing vertical surface 114a of the first pillar 102a may be called a "first left-facing vertical surface" to indicate that the left-facing vertical surface 114a is part of the first pillar 102a. Similarly, a right-facing vertical surface 116a of the first pillar 102a may be called a "first right-facing vertical surface" to indicate that the right-facing vertical surface 116a is part of the first pillar 102a. A left-facing vertical surface 114b of the second pillar 102b may be called a "second left-facing vertical surface" to indicate that the left-facing vertical surface 114b is part of the second pillar 102b. Similarly, a right-facing vertical surface 116b of the second pillar 102b may be called a "second right-facing vertical surface" to indicate that the right-facing vertical surface 116b is part of the second pillar 102b. A left-facing vertical surface 114c of the third pillar 102c may be called a "third left-facing vertical surface" to indicate that the left-facing vertical surface 114c is part of the third pillar 102c. Similarly, a right-facing vertical surface 116c of the third pillar 102c may be called a "third right-facing vertical surface" to indicate that the right-facing vertical surface 116c is part of the third pillar 102c.

The pillar 102 may be a semiconductor and may comprise, consist of, or consist essentially of semiconductor material. The semiconductor material may comprise, consist of, or consist essentially of one or more of silicon, germanium, gallium arsenide, or any other chemical element or chemical compound capable of acting as a semiconductor. In some implementations, the semiconductor material may comprise, consist of, or consist essentially of doped silicon. The silicon may be, for example, monocrystalline silicon, polycrystalline silicon, or amorphous silicon.

The upper source/drain 104, the middle source/drain 106, and/or the lower source/drain 108 (referred to collectively as "source/drains") may be doped semiconductors and may comprise, consist of, or consist essentially of doped semiconductor material, such as n-type doped semiconductor material. The source/drains may be n-type doped by incorporating a chemical element or chemical compound that includes electron donor atoms (e.g., phosphorous and/or arsenic) into the semiconductor material (e.g., silicon). In some implementations, the source/drains may be heavily doped.

In some implementations, one or more of the source/drains may comprise, consist of, or consist essentially of conductive material (e.g., other than the doped semiconductor material). For example, one or more of the source/drains may comprise, consist of, or consist essentially of a metal silicide (e.g., titanium silicide and/or tungsten silicide) and/or other conductive material (e.g., titanium and/or tungsten). In some implementations, the upper source/drain 104 and/or the lower source/drain 108 may cap the pillar 102, such that that the upper source/drain 104 and/or the lower source/drain 108 does not include the semiconductor material of the pillar 102.

The upper channel 110 and/or the lower channel 112 (referred to collectively as "channels") may be intrinsic semiconductors and may comprise, consist of, or consist essentially of intrinsic semiconductor material, such as undoped semiconductor material. Alternatively, the channels may be lightly doped using n-type doping. However, the source/drains may be more heavily doped (e.g., with more electron donor atoms) than the channels.

As further shown in FIGS. 1A-1C, the structure 100 may include multiple upper gates 122 and multiple lower gates 124. An individual pillar, such as a first pillar 102a, may be proximate to (e.g., physically near) four gates, including two upper gates 122 and two lower gates 124. For example, the first pillar 102a may be proximate to a first upper gate 122a (sometimes referred to as a "first gate"), a first lower gate 124a (sometimes referred to as a "second gate"), a second upper gate 122b (sometimes referred to as a "third gate"), and a second lower gate 124b (sometimes referred to as a "fourth gate").

The first upper gate 122a and the second upper gate 122b may be proximate to an upper channel 110a of the first pillar 102a, and the two upper gates 122a, 122b may be located on opposite sides (e.g., a first side and a second side) of the first pillar 102a with respect to one another. The first lower gate 124a and the second lower gate 124b may be proximate to a lower channel 112a of the first pillar 102a, and the two lower gates 124a, 124b may be located on opposite sides of the first pillar 102a with respect to one another. Each of the four gates 122a, 122b, 124a, and 124b may be separated from the first pillar 102a by a respective gate dielectric 126, shown as upper gate dielectrics 126a and lower gate dielectrics 126b.

In this arrangement, the first upper gate 122a and the second lower gate 124b form a diagonally opposite gate pair because the gates 122a, 124b are positioned on opposite sides (e.g., a first side and a second side) of the first pillar 102a, and are positioned at different heights (e.g., a first height and a second height) of the first pillar 102a such that one of the gates controls the flow of current through a first portion (e.g., a first channel) of the first pillar 102a and the other gate controls the flow of current through a second portion (e.g., a second channel) of the first pillar 102a. For example, the first upper gate 122a controls the flow of current through the upper channel 110a (e.g., between the upper source/drain 104a and the middle source/drain 106a), and the second lower gate 124b controls the flow of current through the lower channel 112a (e.g., between the lower source/drain 108a and the middle source/drain 106a).

Also, the second upper gate 122b and the first lower gate 124a form a diagonally opposite gate pair because the gates 122b, 124a are positioned on opposite sides of the first pillar 102a, and are positioned at different heights of the first pillar 102a such that one of the gates controls the flow of current through a first portion (e.g., a first channel) of the first pillar 102a and the other gate controls the flow of current through a second portion (e.g., a second channel) of the first pillar 102a. For example, the second upper gate 122b controls the flow of current through the upper channel 110a (e.g., between the upper source/drain 104a and the middle source/drain 106a), and the first lower gate 124a controls the flow of current through the lower channel 112a (e.g., between the lower source/drain 108a and the middle source/drain 106a). As described in more detail below in connection with FIG. 2, only one of these diagonally opposite gate pairs of the first pillar 102a (e.g., either the first upper gate 122a and the second lower gate 124b, or the second upper gate 122b and the first lower gate 124a) are electrically coupled to one another to control the flow of current through the first pillar 102a.

The first pillar 102a includes a left-facing vertical surface 114a that faces the first upper gate 122a and the first lower gate 124a. Furthermore, the left-facing vertical surface 114a may face a second pillar 102b, such that the left-facing vertical surface 114a of the first pillar 102a faces a right-facing vertical surface 116b of the second pillar 102b. Thus, the first upper gate 122a and the first lower gate 124a may be located between the first pillar 102a and the second pillar 102b (e.g., may be in a region between the first pillar 102a and the second pillar 102b).

For example, the first upper gate 122a may be proximate to a first upper channel 110a of the first pillar 102a and may be proximate to a second upper channel 110b of the second pillar 102b. More specifically, the first upper gate 122a may be separated from the first upper channel 110a of the first pillar 102a by an upper gate dielectric 126a, and may be separated from the second upper channel 110b of the second pillar 102b by another upper gate dielectric 126a. Similarly, the first lower gate 124a may be proximate to a first lower channel 112a of the first pillar 102a and may be proximate to a second lower channel 112b of the second pillar 102b. More specifically, the first lower gate 124a may be separated from the first lower channel 112a of the first pillar 102a by a lower gate dielectric 126b, and may be separated from the second lower channel 112b of the second pillar 102b by another lower gate dielectric 126b.

The first pillar 102a also includes a right-facing vertical surface 116a that faces the second upper gate 122b and the second lower gate 124b. Furthermore, the right-facing vertical surface 116a may face a third pillar 102c, such that the right-facing vertical surface 116a of the first pillar 102a faces a left-facing vertical surface 114c of the third pillar 102c. Thus, the second upper gate 122b and the second lower gate 124b may be located between the first pillar 102a and the third pillar 102c (e.g., may be in a region between the first pillar 102a and the third pillar 102c).

For example, the second upper gate 122b may be proximate to a first upper channel 110a of the first pillar 102a and may be proximate to a third upper channel 110c of the third pillar 102c. More specifically, the second upper gate 122b may be separated from the first upper channel 110a of the first pillar 102a by an upper gate dielectric 126a, and may be separated from the third upper channel 110c of the third pillar 102c by another upper gate dielectric 126a. Similarly, the second lower gate 124b may be proximate to a first lower channel 112a of the first pillar 102a and may be proximate to a third lower channel 112c of the third pillar 102c. More specifically, the second lower gate 124b may be separated from the first lower channel 112a of the first pillar 102a by a lower gate dielectric 126b, and may be separated from the third lower channel 112c of the third pillar 102c by another lower gate dielectric 126b.

A gate dielectric 126 is located between a gate (e.g., each of the gates 122, 124) and a channel proximate to the gate (e.g., a channel 110, 112). The gate dielectric 126 may be in contact with the gate and the channel. The gate dielectric 126 may have any suitable vertical height (e.g., in a third direction 128, which may be perpendicular to the first direction 118 and the second direction 120). As shown in FIG. 1B, in some implementations, the gate dielectric 126 has a bottom that is horizontally aligned with the bottom of an abutting gate. However, in some implementations, the bottom of the gate dielectric 126 may be lower than the bottom of the abutting gate. As further shown in FIG. 1B, in some implementations, the gate dielectric 126 has a top that is higher than the top of the abutting gate. However, in some implementations, the top of the gate dielectric 126 may be aligned with the top of the abutting gate.

The upper gates 122 and/or the lower gates 124 may be electrical conductors and may comprise, consist of, or consist essentially of electrically conductive material. The electrically conductive material may comprise, consist of, or consist essentially of a metal (e.g., titanium, tungsten, cobalt, nickel, platinum, and/or ruthenium), a metal composition (e.g., a metal silicide, a metal nitride, and/or a metal carbide), and/or a conductively-doped semiconductor material (e.g., conductively-doped silicon, conductively-doped germanium, and/or conductively-doped gallium arsenide).

The gate dielectric 126 may be an electrical insulator capable of being polarized by an applied electric field (e.g., via dielectric polarization) and may comprise, consist of, or consist essentially of dielectric material. The dielectric material may comprise, consist of, or consist essentially of one or more of silicon dioxide, silicon nitride, aluminum oxide, or hafnium oxide, among other examples.

As further shown in FIGS. 1A-1C, the structure 100 may include a non-gate region between pillars 102. The non-gate region may include all of the space between pillars 102 other than the space occupied by the gates 122, 124. For example, the non-gate region may include the gate dielectrics 126 and a non-dielectric region. The non-dielectric region may include an upper non-gate region 130, a middle non-gate region 132, and a lower non-gate region 134. An upper non-gate region 130 may be above and/or abutting an upper gate 122 and/or upper gate dielectrics 126*a*. In some implementations, the upper non-gate region 130 is below and/or abutting an insulator 136. A middle non-gate region 132 may be below and/or abutting an upper gate 122 and/or the upper gate dielectrics 126*a*, and the middle non-gate region 132 may be above and/or abutting a lower gate 124 and/or the lower gate dielectrics 126*b*. The lower non-gate region 134 may be below and/or abutting a lower gate 124 and/or the lower gate dielectrics 126*b*.

The non-gate region may be an electrical insulator and may comprise, consist of, or consist essentially of insulative material. The insulative material may comprise, consist of, or consist essentially of silicon dioxide, silicon nitride, aluminum oxide, or hafnium oxide, among other examples. In some implementations, the upper non-gate region 130, the middle non-gate region 132, and the lower non-gate region 134 may comprise, consist of, or consist essentially of a same (e.g., single) insulative material. In some implementations, the gate dielectrics 126 and the non-dielectric region of the non-gate region may comprise, consist of, or consist essentially of a same (e.g., single) insulative material. Alternatively, the gate dielectrics 126 may comprise, consist of, or consist essentially of a different insulative material than the non-dielectric region (e.g., the upper non-gate region 130, the middle non-gate region 132, and/or the lower non-gate region 134) of the non-gate region.

As further shown in FIGS. 1A-1C, the structure 100 may include multiple electrical contact regions 138. An electrical contact region 138 is above and/or abutting an upper source/drain 104 of a pillar 102. The electrical contact region 138 may be electrically coupled with the upper source/drain 104. The electrical contact region 138 may be an electrical conductor and may comprise, consist of, or consist essentially of electrically conductive material. The electrically conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, and/or a metal carbide), and/or a conductively-doped semiconductor material (e.g., conductively-doped silicon, conductively-doped germanium, and/or conductively-doped gallium arsenide). In FIG. 1A, the reference number 102/138 represents an electrical contact region 138 with a pillar 102 beneath the electrical contact region 138.

Electrical contact regions 138 may be separated from one another via the insulator 136. The insulator 136 is above and/or abutting the non-gate region (e.g., an upper non-gate region 130 of the non-gate region) and/or the upper gate dielectrics 126*a*. In some implementations, the insulator 136 is horizontally aligned with the electrical contact regions 138. Additionally, or alternatively, the insulator 136 may cover all portions of the structure 100 that are not covered by the electrical contact regions 138. The insulator 136 may be an electrical insulator and may comprise, consist of, or consist essentially of insulative material. The insulative material may comprise, consist of, or consist essentially of silicon dioxide and/or silicon nitride, among other examples. In some implementations, the insulator 136 may comprise, consist of, or consist essentially of a different insulative material than the non-gate region.

An upper surface 140 may extend across the insulator 136 and the electrical contact regions 138. The upper surface 140 may be planarized, such as by using chemical-mechanical polishing or another suitable planarization technique.

As further shown in FIGS. 1A-1C, the structure 100 may include multiple capacitors 142, the form of which is not shown. The capacitors 142 may be positioned atop the upper surface 140. A capacitor 142 may include any suitable type of capacitor having any suitable form. The capacitor 142 is above and/or abuts an electrical contact region 138. The capacitor 142 may be electrically coupled with an upper source/drain 104 (e.g., via an electrical contact region 138). The capacitors 142 of the structure 100 may be electrically insulated from one another, such as via the insulator 136 and/or other insulative material between the capacitors 142. Although the first pillar 102*a* is shown using a brace that includes a capacitor 142 and the electrical contact region 138*a*, the first pillar 102*a* may exclude the capacitor 142 and the electrical contact region 138*a*, in some implementations. In some implementations, an electrical component other than a capacitor may be used in place of the capacitor 142 (e.g., for use of the structure 100 in a device other than a memory device).

As further shown in FIGS. 1A-1C, the structure 100 may include multiple digit lines 144. A digit line 144 is beneath a pillar 102 and is electrically coupled with the lower source/drain 108 of the pillar 102. In some implementations, the digit line 144 is beneath and/or abuts the lower source/drain 108 of the pillar 102. The digit line 144 may extend in the first direction 118 and the second direction 120, and may be beneath a column of pillars 102 that is spaced (e.g., substantially evenly) in the first direction 118 and the second direction 120. A digit line 144 may be an electrical conductor and may comprise, consist of, or consist essentially of electrically conductive material. The electrically conductive material may comprise, consist of, or consist essentially of a metal (e.g., titanium, tungsten, cobalt, nickel, platinum, and/or ruthenium), a metal composition (e.g., metal silicide, a metal nitride, such as titanium nitride, and/or a metal carbide), and/or a conductively-doped semiconductor material (e.g., conductively-doped silicon, conductively-doped germanium, and/or conductively-doped gallium arsenide). In FIG. 1B and FIG. 1C, the digit lines 144 abut the lower source/drains 108. In some implementations, the digit lines may comprise, consist of, or consist essentially of metal, the lower source/drains 108 may comprise, consist of, or consist essentially of a conductively-doped semiconductor material, and a metal composition may be present where the conductively-doped semiconductor material of a lower source/drain 108 interfaces with a digit line 144.

In FIG. 1B, the regions between pillars 102 represented by ellipses ( . . . ) may be substantially identical to the region between, for example, the first pillar 102a and the second pillar 102b. As shown in FIG. 1C, along the cross-section 1C-1C, insulative material 146 may be between the pillars 102. The insulative material 146 may be an electrical insulator and may comprise, consist of, or consist essentially of silicon dioxide and/or silicon nitride, among other examples.

The structure 100 may be constructed on and/or supported by a base (not shown). In some implementations, the base is a semiconductor and may comprise, consist of, or consist essentially of semiconductor material. For example, the semiconductor material may comprise, consist of, or consist essentially of silicon, such as monocrystalline silicon. The base is sometimes called a "substrate" or a "semiconductor substrate." In some implementations, the base may include or may be formed from a semiconductive wafer (either alone or in assemblies comprising other materials) and/or semiconductive material layers (either alone or in assemblies comprising other materials). In some implementations, the base may include one or more materials associated with integrated circuit fabrication, such as one or more refractory metal materials, one or more barrier materials, one or more diffusion materials, and/or one or more insulator materials.

As shown in FIGS. 1A-1C, the first pillar 102a may include a first upper source/drain 104a, a first middle source/drain 106a, a first lower source/drain 108a, a first upper channel 110a, and a first lower channel 112a. A first electrical contact region 138a may be electrically coupled with the first upper source/drain 104a. Similarly, the second pillar 102b may include a second upper source/drain 104b, a second middle source/drain 106b, a second lower source/drain 108b, a second upper channel 110b, and a second lower channel 112b. A second electrical contact region 138b may be electrically coupled with the second upper source/drain 104b. Similarly, the third pillar 102c may include a third upper source/drain 104c, a third middle source/drain 106c, a third lower source/drain 108c, a third upper channel 110c, and a third lower channel 112c. A third electrical contact region 138c may be electrically coupled with the third upper source/drain 104c. The digit line 144 may be beneath the first pillar 102a, the second pillar 102b, and the third pillar 102c. The digit line 144 may be electrically coupled with the first lower source/drain 108a, the second lower source/drain 108b, and the third lower source/drain 108c.

In some implementations, the structure may have a pitch along the x-axis and/or a pitch along the y-axis of less than 30 nanometers (nm). For example, the pitch along the x-axis and/or along the y-axis may be approximately 26 nm (or less than 26 nm). Thus, a distance from one vertical edge of a pillar 102 (e.g., a left-facing vertical surface 114 of the pillar 102) to a corresponding vertical edge of a consecutive pillar 102 (e.g., a left-facing vertical surface 114 of the consecutive pillar 102), where there are no pillars between the pillar 102 and the consecutive pillar 102, may be approximately 26 nm (or less than 26 nm). In some implementations, the pillar 102 may be approximately 10 nm (or less than 10 nm) in width along the y-axis, the gates 122, 124 may each be approximately 6 nm (or less than 6 nm) in width along the y-axis, and the gate dielectrics 126 may each be approximately 5 nm (or less than 5 nm) in width along the y-axis. In some implementations, the gates 122, 124 may each be approximately 80 nm (or less than 80 nm) along the z-axis. These dimensions are provided as examples, and these elements may have different dimensions in some implementations.

As indicated above, FIGS. 1A-1C are provided as examples. Other examples may differ from what is described with respect to FIGS. 1A-1C.

Figure 2:
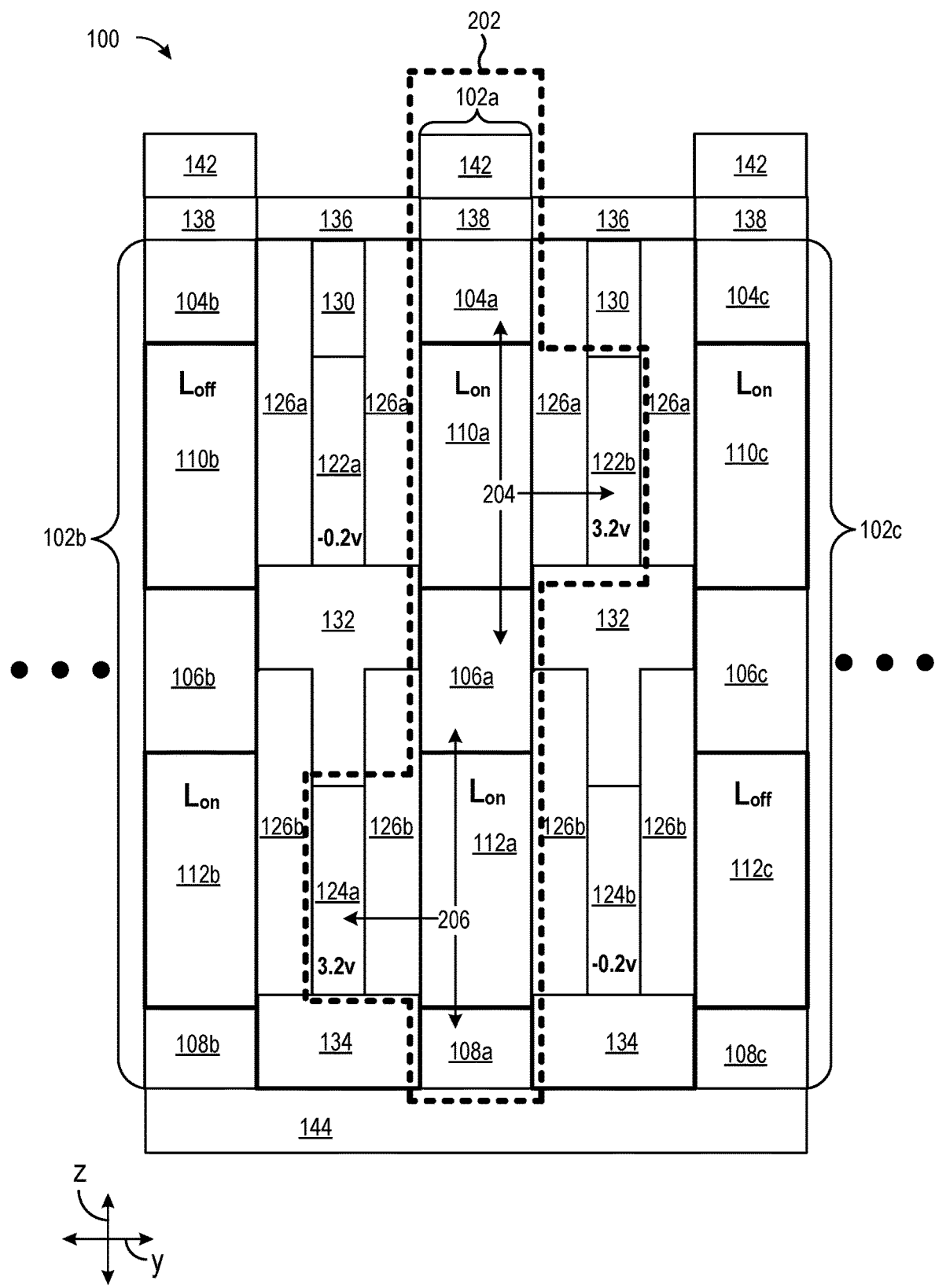
FIG. 2 is a diagrammatic view illustrating an example of using the structure of FIGS. 1A-1C to uniquely address a single memory cell.

FIG. 2 is a diagrammatic view illustrating an example of using the structure 100 to uniquely address a single memory cell 202. The diagrammatic view of FIG. 2 is from the same orientation as that of FIG. 1B (along the line 1B-1B of FIG. 1A). As shown in FIG. 2, the memory cell 202 includes a capacitor 142, an upper transistor 204, and a lower transistor 206. The upper transistor 204 and the lower transistor 206 operate together to access the memory cell 202, such as to enable current to flow to or from the capacitor 142. As shown, the upper transistor 204 and the lower transistor 206 may be field-effect transistors (FETs) that operate using an electric field to control the flow of current in a semiconductor. For example, the upper transistor 204 and the lower transistor 206 may be metal-oxide-semiconductor FETS (MOSFETs), thin-film transistors (TFTs), or the like. The upper transistor 204 and the lower transistor 206 may also be called "access transistors" because the upper transistor 204 and the lower transistor 206 control access to the memory cell 202.

As described above, if a memory cell includes a single transistor, and the gate of that single transistor is located close to two pillars, then activation of the single transistor would allow access to two capacitors (e.g., respectively electrically coupled with the two pillars) of two memory cells. Similarly, for the memory cell 202 shown in FIG. 2, if two transistors positioned on the same side of a pillar 102 are active (simultaneously) and are positioned near two pillars 102 (e.g., the first pillar 102a and the second pillar 102b), then that would allow access to two capacitors 142 (e.g., respectively electrically coupled with the two pillars 102) of two memory cells. This would not allow a single memory cell to be uniquely addressable (and uniquely accessible).

To achieve unique addressability per memory cell using the structure 100, a diagonally opposite gate pair may be used to control access to a memory cell 202. The two gates in the diagonally opposite gate pair are positioned on opposite sides of a pillar 102 of the memory cell 202 and are positioned at different heights of the pillar 102, such that one of the gates controls the flow of current through an upper channel 110 of the pillar 102 and the other gate controls the flow of current through a lower channel 112 of the pillar. In the example of FIG. 2, the first lower gate 124a and the second upper gate 122b are shown as the diagonally opposite gate pair for the first pillar 102a, and gate pairs in corresponding positions may form diagonally opposite gate pairs for other pillars 102. In some implementations (and when the structure is viewed from the opposite side than is shown), the second lower gate 124b and the first upper gate 122a may be the diagonally opposite gate pair for the first pillar 102*a*, and gate pairs in corresponding positions may form diagonally opposite gate pairs for other pillars 102.

To enable a diagonally opposite gate pair to control access to a memory cell 202, the two gates of the diagonally opposite gate pair may be electrically coupled. In the example of FIG. 2, the first lower gate 124*a* and the second upper gate 122*b* are electrically coupled. To ensure unique addressability, the first lower gate 124*a* is not electrically coupled with the first upper gate 122*a* (and is also not electrically coupled with the second lower gate 124*b*). Similarly, the second upper gate 122*b* is not electrically coupled with the second lower gate 124*b* (and is also not electrically coupled with the first upper gate 122*a*).

As shown, an upper transistor 204 may include an upper gate 122 (e.g., the second upper gate 122*b*), an upper source/drain 104 of a pillar 102, and a middle source/drain 106 of the pillar 102. If the second upper gate 122*b* is active (e.g., when a voltage that satisfies a threshold is applied to the second upper gate 122*b*, such as the illustrated voltage of 3.2 volts (V)), then current can flow through the upper channels 110 proximate to the second upper gate 122*b* (shown as a first upper channel 110*a* and a third upper channel 110*c*), as shown by "$L_{on}$" in FIG. 2. Thus, activation of an upper gate 122 causes an upper source/drain 104 and a middle source/drain 106 to be electrically coupled. Similarly, a lower transistor 206 may include a lower gate 124 (e.g., the first lower gate 124*a*), a middle source/drain 106 of a pillar 102, and a lower source/drain 108 of the pillar 102. If the first lower gate 124*a* is active (e.g., when a voltage that satisfies a threshold is applied to the first lower gate 124*a*, shown as a voltage of 3.2V), then current can flow through the lower channels 112 proximate to the first lower gate 124*a* (shown as a first lower channel 112*a* and a second lower channel 112*b*), as shown by "$L_{on}$" in FIG. 2. Thus, activation of a lower gate 124 causes a lower source/drain 108 and a middle source/drain 106 to be electrically coupled.

If a voltage that is below a threshold (e.g., the illustrated voltage of −0.2V) is applied to both upper gates 122 on opposite sides of a pillar 102, then current will be blocked from flowing through the upper channel 110 of the pillar 102, and the upper source/drain 104 of the pillar 102 and the middle source/drain 106 of the pillar 102 will not be electrically coupled with one another (e.g., will be electrically isolated from one another), as shown by "$L_{off}$" in FIG. 2. Similarly, if a voltage that is below a threshold is applied to both lower gates 124 on opposite sides of a pillar 102, then current will be blocked from flowing through the lower channel 112 of the pillar 102, and the lower source/drain 108 of the pillar 102 and the middle source/drain 106 of the pillar 102 will not be electrically coupled with one another (e.g., will be electrically isolated from one another), as shown by "$L_{off}$" in FIG. 2.

If both the second upper gate 122*b* and the first lower gate 124*a* are active, then current can flow through both the first upper channel 110*a* and the first lower channel 112*a* of the first pillar 102*a* situated between the second upper gate 122*b* and first the lower gate 124*a* without allowing current to completely flow through the upper channel 110 and the lower channel 112 of the pillars 102 that are situated on opposite sides of the gates 122*b*, 124*a* with respect to the first pillar 102*a* (e.g., the upper channel 110*b* of the second pillar 102*b* that is situated on an opposite side of the first lower gate 124*a* with respect to the first pillar 102*a*, and the lower channel 112*c* of the third pillar 102*c* that is situated on an opposite side of the second upper gate 122*b* with respect to the first pillar 102*a*). Thus, the memory cell 202 that includes the first pillar 102*a* is uniquely addressable (and uniquely accessible) by the combination of the upper transistor 204 and the lower transistor 206 situated on opposite sides of the first pillar 102*a* (e.g., in combination with a digit line 144).

The ability of a transistor to control whether a first region and a second region (e.g., the upper source/drain 104 and the middle source/drain 106, the middle source/drain 106 and the lower source/drain 108, or the capacitor 142 and the digit line 144) are electrically coupled may be referred to as "selective coupling" (or "selective electrical coupling"). Thus, the upper transistor 204 may selectively couple (e.g., selectively electrically couple) the upper source/drain 104 and the middle source/drain 106, the lower transistor 206 may selectively couple the lower source/drain 108 and the middle source/drain 106, and the first transistor and the second transistor may together (e.g., when both are active) selectively couple the upper source/drain 104 and the lower source/drain 108 (and consequently the capacitor 142 and the digit line 144). Thus, a memory cell formed from a pillar 102, a capacitor 142, an upper transistor 204, and a lower transistor 206 may be selectable by the combination of the upper transistor 204 and the lower transistor 206 (e.g., may be selectable a diagonally opposite gate pair or a diagonally opposite transistor pair). When a first element and a second element are not electrically coupled with one another, the first element and the second element may be electrically isolated from one another.

The term "source/drain" is used for the upper source/drain 104, the middle source/drain 106, and the lower source/drain 108 because these regions (e.g., an upper source/drain region, a middle source/drain region, and a lower source/drain region) of the pillar 102 may act as a source at a first time and as a drain at a second (different) time. In a first scenario, when current flows from a digit line 144 to a capacitor 142, the lower source/drain 108 is a source, and the upper source/drain 104 is a drain. In a second scenario, when current flows from a capacitor 142 to a digit line 144, the upper source/drain 104 is a source, and the lower source/drain 108 is a drain. In both the first scenario and the second scenario, the middle source/drain 106 acts as both a source and a drain. In the first scenario where current flows from a digit line 144 to a capacitor 142, the middle source/drain 106 is a drain for the lower channel 112 and is a source for the upper channel 110. In the second scenario where current flows from a capacitor 142 to a digit line 144, the middle source/drain 106 is a drain for the upper channel 110 and is a source for the lower channel 112. Other terminology may be used, such as an "upper pillar region" or an "upper doped region" for the upper source/drain 104, a "middle pillar region" or a "middle doped region" for the middle source/drain 106, and a "lower pillar region" or a "lower doped region" for the lower source/drain 108.

To ensure that the upper transistor 204 and the lower transistor 206 with respective gates on opposite sides of a pillar 102 (e.g., an upper transistor 204 and a lower transistor 206 with gates that are diagonally opposite of one another) operate together (e.g., are both activated by the same applied voltage), a gate of the upper transistor 204 and a gate of the lower transistor 206 may be electrically coupled with one another. For example, the upper gate 122 of the upper transistor 204 may be electrically coupled with the lower gate 124 of the lower transistor 206. The upper gate 122 and the lower gate 124 may form a diagonally opposite gate pair.

The electrically coupled upper gate 122 and lower gate 124 may form part of and/or may be coupled to an access line of a memory array (sometimes called a "row line" or a "word line" of the memory array). The access line formed by electrically coupling the upper gate 122 and the lower gate 124 may be called a "logical access line" to differentiate from an access line that is traditionally a single physical line (e.g., as represented by a single gate in FIG. 2). In some implementations, the upper gate 122 is coupled (e.g., electrically or physically) to an upper physical access line that extends through the memory array, the lower gate 124 is coupled (e.g., electrically or physically) to a lower physical access line that extends through the memory array, and the upper physical access line and the lower physical access line are electrically coupled to one another to form a single logical access line. In this way, the single logical access line, in combination with a digit line 144, may be capable of uniquely addressing an individual memory cell 202 (e.g., by allowing current to flow through the pillar 102 when a threshold voltage is applied to the logical access line). To reduce ambiguity of the term "access line," the upper physical access line may be called an "upper electrical line," and the lower physical access line may be called a "lower electrical line" in some cases. In these cases, the upper electrical line and the lower electrical line may be electrically coupled with one another to form an access line (e.g., a "logical access line").

As indicated above, FIG. 2 is provided as an example. Other examples may differ from what is described with respect to FIG. 2.

Figure 3:
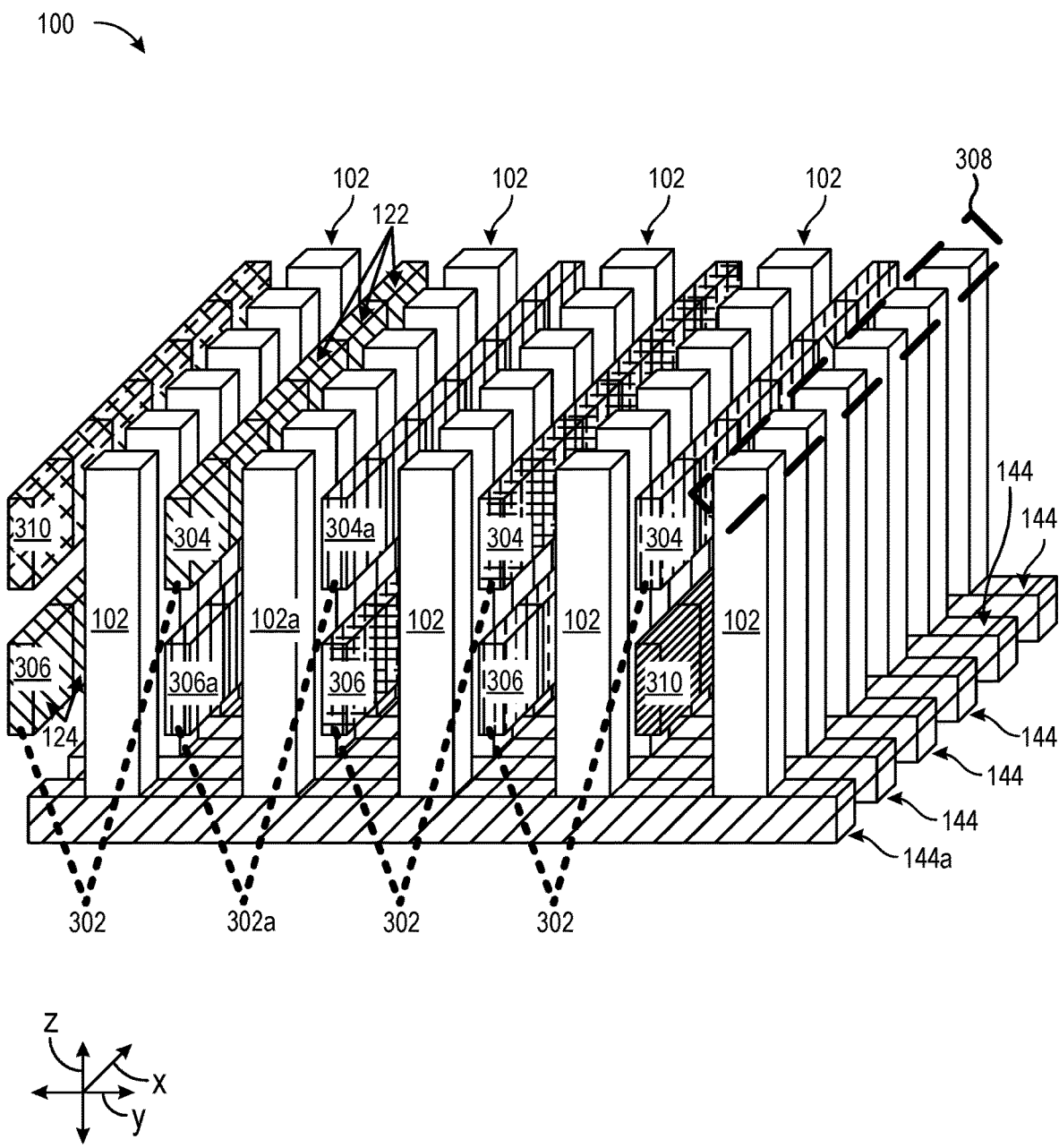
FIG. 3 is a perspective view of pillars, digit lines, and access lines of the structure of FIGS. 1A-1C.

FIG. 3 is a perspective view of the pillars 102, digit lines 144, and access lines of the example structure 100. As described above, a logical access line 302 may be formed by electrically coupling two physical access lines, such as an upper physical access line 304 and a lower physical access line 306 that are on opposite sides of a pillar 102 that is part of a memory cell to be uniquely addressed by the logical access line 302 (e.g., in combination with a digit line 144). A row of upper gates 122 (e.g., electrically coupled to one another) may form an upper physical access line 304, and a row of lower gates 124 (e.g., electrically coupled to one another) may form a lower physical access line 306.

For example, an upper physical access line 304a and a lower physical access line 306a may be electrically coupled to form a logical access line 302a. The logical access line 302a, in combination with the digit line 144a, is capable of uniquely addressing a memory cell 202a (not shown) that includes the first pillar 102a. For example, a sense amplifier coupled to the digit line 144a can read a value stored in the memory cell 202a (e.g., by sensing whether the capacitor electrically coupled to the first pillar 102a is charged or discharged) when a threshold voltage is applied to the logical access line 302a. Similarly, a sense amplifier coupled to the digit line 144a can write a value to the memory cell 202a (e.g., by charging or discharging the capacitor electrically coupled to the first pillar 102a) when a threshold voltage is applied to the logical access line 302a.

As described above, an upper gate 122 may be electrically coupled with an upper physical access line 304, a lower gate 124 may be electrically coupled with a lower physical access line 306, and the upper physical access line 304 and the lower physical access line 306 may be electrically coupled to one another to form a single logical access line 302. For example, an upper gate 122a may be electrically coupled with the upper physical access line 304a, the lower gate 124a may be electrically coupled with the lower physical access line 306a, and the upper physical access line 304a and the lower physical access line 306a may be electrically coupled to one another to form the logical access line 302a. Thus, when a voltage is applied to the logical access line 302a, the upper gate 122a and the lower gate 124a are both activated, and the memory cell 202a can be accessed (e.g., is accessible) by a sense amplifier electrically coupled to the digit line 144a.

In some implementations, an upper physical access line 304 and a lower physical access line 306 that are diagonally opposite from one another (and hence, an upper gate 122 and a lower gate 124 that are diagonally opposite from one another) may be electrically coupled by a coupling or a connector at an outer edge of an integrated assembly (e.g., a memory array) that includes the structure 100. Additionally, or alternatively, an upper physical access line 304 and a lower physical access line 306 that are diagonally opposite from one another may be electrically coupled by a coupling or a connector at or on another component of a memory device that includes the integrated assembly, such as at or on a row decoder.

In some implementations, the memory array may include a dummy column 308 of dummy pillars and corresponding dummy memory cells, at the edge of the memory array, that are not addressable because a dummy pillar does not have a corresponding diagonally opposite gate pair (e.g., only has one gate of the gate pair). Additionally, or alternatively, the memory array may include one or more dummy physical access lines 310, at or near the edge of the memory array, that are not capable of addressing any memory cells because a dummy physical access line 310 does not have a corresponding physical access line that is diagonally opposite from the dummy physical access line 310.

As shown in FIG. 3, the structure 100 and/or an integrated assembly that includes the structure 100 may include multiple digit lines 144. Each digit line 144 may extend across and/or through the structure 100 and/or the integrated assembly (e.g., a memory array) along a first axis, shown as a y-axis. The digit lines 144 may be electrically separated from one another and spaced (e.g., substantially evenly) along a second axis, shown as an x-axis. The digit lines 144 may be substantially identical to one another (e.g., where "substantially" is defined as "within reasonable tolerances of manufacturing and measurement").

As further shown in FIG. 3, the structure 100 and/or an integrated assembly that includes the structure 100 may include multiple upper physical access lines 304 and multiple lower physical access lines 306. Each upper physical access line 304 and each lower physical access line 306 may extend across and/or through the structure 100 and/or the integrated assembly (e.g., a memory array) along the second axis (e.g., the x-axis). The upper physical access lines 304 may be electrically separated from one another and spaced (e.g., substantially evenly) along the first axis (e.g., the y-axis). Similarly, the lower physical access lines 306 may be electrically separated from one another and spaced (e.g., substantially evenly) along the first axis (e.g., the y-axis). The upper physical access lines 304 may be substantially identical to one another, and/or the lower physical access lines 306 may be substantially identical to one another. In some implementations, the upper physical access lines 304 and the lower physical access lines 306 may be substantially identical to one another. Furthermore, the pairs of diagonally opposite physical access lines may be substantially identical to one another, the pairs of diagonally opposite gates may be substantially identical to one another, and/or the logical access lines may be substantially identical to one another.

As further shown in FIG. 3, the structure 100 and/or an integrated assembly that includes the structure 100 may include multiple pillars 102. Each pillar 102 may extend across and/or through the structure 100 and/or the integrated assembly (e.g., a memory array), such as from a digit line 144 to a capacitor 142 and/or an electrical contact region 138, along a third axis, shown as a z-axis. The pillars 102 may be spaced (e.g., substantially evenly) along the first axis (e.g., the y-axis) and the second axis (e.g., the x-axis) to form a grid pattern or an array pattern. The pillars 102 may be substantially identical to one another.

As further shown in FIG. 3, the structure 100 and/or an integrated assembly that includes the structure 100 may include multiple memory cells. The memory cells may be spaced (e.g., substantially evenly) along the first axis (e.g., the y-axis) and the second axis (e.g., the x-axis) to form a grid pattern. The memory cells may be substantially identical to one another. A memory array may include hundreds, thousands, millions, or more memory cells.

Furthermore, each of the x-axis, the y-axis, and the z-axis is substantially perpendicular to the other two axes. For example, the x-axis is substantially perpendicular to the y-axis and the z-axis, the y-axis is substantially perpendicular to the x-axis and the z-axis, and the z-axis is substantially perpendicular to the x-axis and the y-axis.

As indicated above, FIG. 3 is provided as an example. Other examples may differ from what is described with respect to FIG. 3.

FIG. 4 is a flowchart of an example method 400 of forming an integrated assembly having a diagonally opposite gate pair per memory cell. In some implementations, one or more blocks of FIG. 4 may be performed by various semiconductor fabrication equipment.

As shown in FIG. 4, the method 400 may include forming a structure that includes a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction; an upper gate proximate to the upper channel, wherein the right-facing vertical surface faces the upper gate; a lower gate proximate to the lower channel, wherein the left-facing vertical surface faces the lower gate; an electrical contact region coupled with the upper source/drain; and an electrical line that is beneath the pillar and that is electrically coupled with the lower source/drain (block 410). As further shown in FIG. 4, the method 400 may include electrically coupling the upper gate and the lower gate (block 420).

Although FIG. 4 shows example blocks of the method 400, in some implementations, the method 400 may include additional blocks, fewer blocks, different blocks, or differently arranged blocks than those depicted in FIG. 4. In some implementations, the method 400 may include forming the structure 100, an integrated assembly that includes the structure 100, any part described herein of the structure 100, and/or any part described herein of an integrated assembly that includes the structure 100. For example, the method 400 may include forming one or more of the parts 102-116, 122-126, 130-146, 202-206, and/or 302-310.

FIGS. 5A-5B through FIGS. 13A-13B are diagrammatic views showing formation of the structure 100 at example process stages of an example process of forming an integrated assembly having a diagonally opposite gate pair per memory cell. In some implementations, the example process described below in connection with FIGS. 5A-5B through FIGS. 13A-13B may correspond to the method 400 and/or one or more blocks of the method 400, such as block 410. However, the process described below is an example, and other example processes may be used to form the structure 100, an integrated assembly that includes the structure 100, and/or one or more parts of the structure 100 and/or the integrated assembly.

Figure 5A:
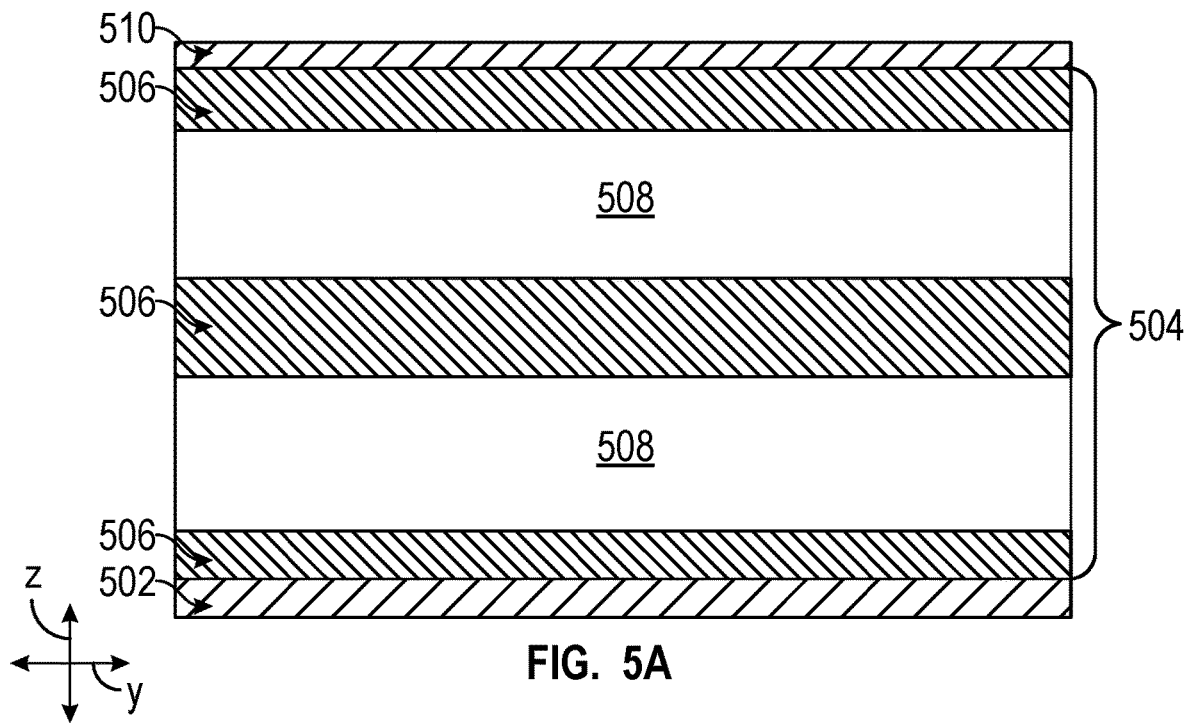
FIGS. 5A and 5B are diagrammatic views showing formation of the structure of FIGS. 1A-1C at an example process stage of an example process of forming an integrated assembly having a diagonally opposite gate pair per memory cell.
Figure 5B:
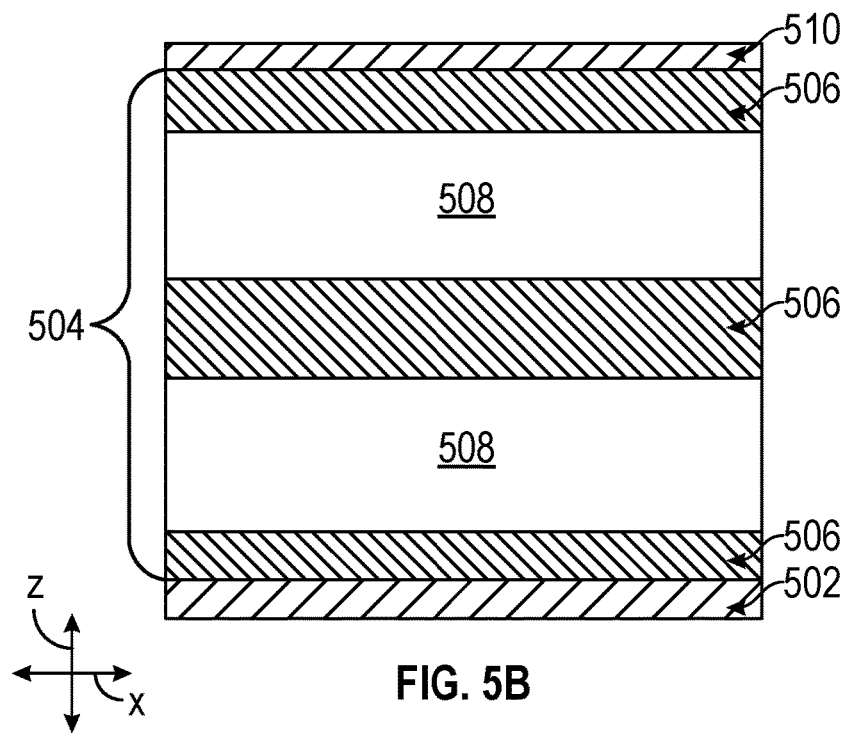

As shown in FIGS. 5A and 5B, the process may include forming (e.g., depositing or growing) an electrically conductive material 502 on a substrate (not shown, but which may be beneath the electrically conductive material 502). The electrically conductive material 502 may form the digit lines 144 and may comprise, consist of, or consist essentially of one or more of the materials described above in connection with the digit lines 144. For example, the electrically conductive material 502 may comprise, consist of, or consist essentially of tungsten or titanium nitride, among other examples.

As further shown, the process may include forming (e.g., depositing or growing) a semiconductor material 504 on the electrically conductive material 502. The semiconductor material 504 may form the pillars 102 and may comprise, consist of, or consist essentially of one or more of the materials described above in connection with the pillars 102. For example, the semiconductor material 504 may comprise, consist of, or consist essentially of polycrystalline silicon, among other examples.

As further shown, the process may include doping the semiconductor material 504 to form three doped regions 506 (e.g., a first doped region, a second doped region, and a third doped region). The semiconductor material 504 may be doped to form upper source/drains 104 (e.g., from the first doped region), middle source/drains 106 (e.g., from the second doped region), and lower source/drains 108 (e.g., from the third doped region), and the three doped regions 506 may form (in order from top to bottom) upper source/drains 104, middle source/drains 106, and lower source/drains 108. The doped regions 506 may comprise, consist of, or consist essentially of one or more of the materials described above in connection with the source/drain regions. For example, the doped regions 506 may comprise, consist of, or consist essentially of n-type doped semiconductor material. In some implementations, the semiconductor material 504 may be doped using ion implantation. Alternatively, the semiconductor material 504 may be doped using in situ doping, such that the semiconductor material 504 is doped as the semiconductor material 504 is being formed (e.g., grown or deposited). In some implementations, the process may include activating the dopants to form the doped regions 506.

As further shown, the process may include forming two regions 508, which may be undoped or lightly doped. For example, the formation and doping of the semiconductor material 504 to form the three doped regions 506 as described above may result in the two regions 508. The two regions 508 may form (in order from top to bottom) upper channels 110 and lower channels 112. The regions 508 may comprise, consist of, or consist essentially of one or more of the materials described above in connection with the upper channel 110 and the lower channel 112. For example, the two regions 508 may comprise, consist of, or consist essentially of polycrystalline silicon, among other examples.

As further shown, the process may include forming (e.g., depositing or growing) electrically conductive material 510 on the semiconductor material 504. The electrically conductive material 510 may form the electrical contact regions 138 and may comprise, consist of, or consist essentially of one or more of the materials described above in connection with the electrical contact regions 138. For example, the electrically conductive material 510 may comprise, consist of, or consist essentially of titanium nitride, among other examples.

As further shown, the first doped region (e.g., corresponding to upper source/drains 104) may be formed proximate to the electrically conductive material 510 such that the first doped region and the electrically conductive material 510 are electrically coupled. For example the electrically conductive material 510 may be on top of and/or abutting the first doped region. The third doped region (e.g., corresponding to lower source/drains 108) may be formed proximate to the electrically conductive material 502 such that the third doped region and the electrically conductive material 502 are electrically coupled. For example the third doped region may be on top of and/or abutting the electrically conductive material 502. The second doped region (e.g., corresponding to middle source/drains 106) may be formed such that the second doped region is positioned between but separated from the first doped region and the third doped region. For example, the second doped region may be separated from each of the first doped region and the third doped region by a respective region 508.

As shown in FIGS. 6A and 6B, the process may include forming a mask 602 on the electrically conductive material 510 (e.g., the upper surface 140). The mask 602 may comprise, consist of, or consist essentially of a semiconductor mask material. For example, the mask 602 may comprise, consist of, or consist essentially of silicon dioxide, among other examples. In some implementations, the mask 602 may be formed using patterning, such as multi-patterning (e.g., quadruple patterning). As shown, the mask 602 may span the entirety of the integrated assembly along the y-axis, and may be spaced (e.g., substantially evenly) along the x-axis. This process step may be referred to as digit line masking and/or digit line patterning because removal of material subsequent to the masking results in the digit lines 144.

As further shown, the process may include removing (e.g., etching) material in unmasked regions 604. The removed material may include the electrically conductive material 510, the semiconductor material 504 (e.g., the three doped regions 506 and the two regions 508), and the electrically conductive material 502. Thus, the removal may be full stack removal (e.g., a full stack etch) to remove all material except for the substrate (not shown) along the unmasked regions 604. This process step results in the digit lines 144.

As shown in FIGS. 7A and 7B, the process may include forming (e.g., depositing or growing) insulative material 702 in the unmasked regions 604. As shown, the insulative material 702 may be formed between the columns of semiconductor material 504 along the x-axis. The insulative material 702 may fill a region from the substrate (not shown) to the top of the stack of material (e.g., may fill an entirety of the unmasked regions 604). The insulative material 702 may comprise, consist of, or consist essentially of one or more of the materials described above in connection with the insulative material 146. For example, the insulative material 702 may comprise, consist of, or consist essentially of silicon dioxide, among other examples.

As further shown, the process may include planarizing the upper surface 140 of the integrated assembly. For example, the upper surface 140 may be planarized using chemical-mechanical polishing or another suitable planarization technique.

As shown in FIGS. 8A and 8B, the process may include forming (e.g., depositing or growing) a mask 802 on the upper surface 140 (e.g., on the electrically conductive material 510 and the insulative material 702). The mask 802 may comprise, consist of, or consist essentially of a semiconductor mask material. For example, the mask 802 may comprise, consist of, or consist essentially of silicon nitride, among other examples. As shown, the mask 802 may span the entirety of the integrated assembly (e.g., along both the x-axis and the y-axis).

As shown in FIGS. 9A and 9B, the process may include forming a mask 902 on the mask 802. The mask 902 may comprise, consist of, or consist essentially of a semiconductor mask material. For example, the mask 902 may comprise, consist of, or consist essentially of silicon dioxide, among other examples. In some implementations, the mask 902 may be formed using patterning, such as multi-patterning (e.g., quadruple patterning). As shown, the mask 902 may span the entirety of the integrated assembly along the x-axis, and may be spaced (e.g., substantially evenly) along the y-axis. This process step may be referred to as pillar masking (or TFT pillar masking) and/or pillar patterning (or TFT pillar patterning) because removal of material subsequent to the masking results in the pillars 102.

As further shown, the process may include removing (e.g., etching) material in unmasked regions 904. The removed material may include the mask 802, the electrically conductive material 510, the semiconductor material 504 (e.g., the three doped regions 506 and the two regions 508), and an unmasked portion of the insulative material 702. Thus, the removal may remove all of the stack down to the electrically conductive material 502 (e.g., the digit lines 144) along the unmasked regions 904, leaving the electrically conductive material 502 in place along the unmasked regions 904. This process step results in the pillars 102.

As shown in FIGS. 10A and 10B, the process may include forming insulative material 1002 on the electrically conductive material 502 in the unmasked regions 904. As shown, the insulative material 1002 may be formed between the pillars 102 along the y-axis. The insulative material 1002 may fill a region from the electrically conductive material 502 to a sufficient height to enable operation of lower gates 124. Although the top of the insulative material 1002 is shown as being above the top of each lower source/drain 108, in some implementations, the top of the insulative material 1002 may be below or substantially aligned with the top of each lower source/drain 108. The insulative material 1002 may form the lower non-gate region 134 and may comprise, consist of, or consist essentially of one or more of the materials described above in connection with the non-gate region. For example, the insulative material 1002 may comprise, consist of, or consist essentially of silicon dioxide, among other examples. In some implementations, the insulative material 1002 (e.g., the lower non-gate region 134) may be formed by forming (e.g., depositing or growing) the insulative material 1002 in the entirety of the unmasked regions 904 (e.g., filling the unmasked regions 904 with the insulative material 1002) and then removing (e.g., etching, such as dry etching) the insulative material 1002 to the appropriate height. Alternatively, the insulative material 1002 (e.g., the lower non-gate region 134) may be formed by growing the insulative material 1002 on the electrically conductive material 502 to the appropriate height.

As shown in FIGS. 11A and 11B, the process may include forming dielectric material 1102 abutting the pillars 102 and on top of a portion of the insulative material 1002 (and, in some implementations, over the mask 802). In some implementations, the dielectric material 1102 may form the lower gate dielectrics 126*b* and/or the upper gate dielectrics 126*a* and may comprise, consist of, or consist essentially of one or more of the materials described above in connection with the gate dielectrics 126. For example, the dielectric material 1102 may comprise, consist of, or consist essentially of one or more of silicon dioxide, silicon nitride, aluminum oxide, or hafnium oxide, among other examples. In some implementations, the dielectric material 1102 and the insulative material 1002 are the same material. As shown, the dielectric material 1102 may be formed in two columns 1104 above the insulative material 1002, with each of the two columns 1104 abutting a separate pillar 102 and with a gap 1106 between the two columns 1104. In some implementations, the dielectric material 1102 may be grown horizontally from the pillars 102 to an appropriate width (e.g., to enable operation of lower gates 124) to form the columns 1104 and the gap 1106. Alternatively, the dielectric material 1102 may be deposited to fill the region between pillars 102, a mask may be applied over the columns 1104, and then an unmasked portion of the deposited dielectric material 1102 (e.g., the gap 1106) may be removed (e.g., etched).

As further shown, the process may include forming (e.g., growing or depositing) electrically conductive material 1108 in the gap 1106 (e.g., on top of the insulative material 1002 and between the columns 1104 of dielectric material 1102). The electrically conductive material 1108 may form the lower gates 124 and may comprise, consist of, or consist essentially of a metal (e.g., titanium, tungsten, cobalt, nickel, platinum, and/or ruthenium), a metal composition (e.g., a metal silicide, a metal nitride, and/or a metal carbide), and/or a conductively-doped semiconductor material (e.g., conductively-doped silicon, conductively-doped germanium, and/or conductively-doped gallium arsenide).

As shown in FIGS. 12A and 12B, the process may include removing (e.g., etching) material between the pillars 102 to form the lower gates 124 from the remaining electrically conductive material 1108. In some implementations (as shown), the removed material may include the dielectric material 1102 and the electrically conductive material 1108, which may both be removed to form the lower gates 124 at an appropriate height to enable operation of lower gates 124. Although the top of each lower gate 124 (e.g., shown as electrically conductive material 1108) is shown as being below the bottom of each middle source/drain 106, in some implementations, the top of each lower gate 124 may be above or substantially aligned with the bottom of each middle source/drain 106.

As further shown, in some implementations, the process may include forming insulative material 1202 between the pillars 102 and on the electrically conductive material 1108 of the lower gates 124 (and on dielectric material 1102 abutting the lower gates 124). The insulative material 1202 may form the middle non-gate region 132 and/or a portion (e.g., a top portion) of the lower gate dielectrics 126*b* and may comprise, consist of, or consist essentially of one or more of the materials described above in connection with the non-gate region and/or the gate dielectrics 126. For example, the insulative material 1202 may comprise, consist of, or consist essentially of silicon dioxide, among other examples.

In some implementations, the process may include filling the region between pillars 102 and above the height of the lower gates 124 with the insulative material 1202, and then removing (e.g., etching) a portion of the insulative material 1202 to an appropriate height. Although the top of the insulative material 1202 is shown as being above the top of each middle source/drain 106, in some implementations, the top of the insulative material 1202 may be below or substantially aligned with the top of each middle source/drain 106. These example process steps of filling the region between pillars 102 with the insulative material 1202 followed by subsequent etching may be used, for example, when the insulative material 1202 is the same as the dielectric material 1102 (e.g., silicon dioxide).

Alternatively, after the process stage described above in connection with FIGS. 11A and 11B is complete, the process may include removing (e.g., etching) only the electrically conductive material 1108 between the pillars 102 to form the lower gates 124 (rather than removing both the electrically conductive material 1108 and the dielectric material 1102). This may leave the dielectric material 1102 (e.g., along an entire height of the pillars 102). The process may include filling a gap 1204 between the dielectric material 1102 and above the electrically conductive material 1108 with the insulative material 1202 to form the middle non-gate region 132 (e.g., via deposition, or via filling and subsequent removal). These example process steps of removing only the electrically conductive material 1108 and then forming the insulative material 1202 in the gap 1204 may be used, for example, when the insulative material 1202 is different from the dielectric material 1102.

As shown in FIGS. 13A and 13B, similar process steps as described above in connection with FIGS. 11A-11B and 12A-12B are performed to form the upper gates 122, the upper non-gate regions 130, and (in some implementations, such as when dielectric material 1102 is removed in the process steps described above in connection with FIGS. 12A-12B) the upper gate dielectrics 126*a*.

For example, the process may include forming dielectric material 1302 abutting the pillars 102 and on top of the lower gate dielectrics 126. In some implementations, the dielectric material 1302 may form the upper gate dielectrics 126*a* and may comprise, consist of, or consist essentially of one or more of the materials described above in connection with the gate dielectrics 126. For example, the dielectric material 1302 may comprise, consist of, or consist essentially of one or more of silicon dioxide, silicon nitride, aluminum oxide, or hafnium oxide, among other examples. As shown, the dielectric material 1302 may be formed in two columns 1304 above the middle non-gate region 132, with each of the two columns 1304 abutting a separate pillar 102 and with a gap 1306 between the two columns 1304. In some implementations, the dielectric material 1302 may be grown horizontally from the pillars 102 to an appropriate width (e.g., to enable operation of upper gates 122) to form the columns 1304 and the gap 1306. Alternatively, the dielectric material 1302 may be deposited to fill the region between pillars 102, a mask may be applied over the columns 1304, and then an unmasked portion of the deposited dielectric material 1302 (e.g., the gap 1306) may be removed (e.g., etched).

As further shown, the process may include forming (e.g., growing or depositing) electrically conductive material 1308 in the gap 1306 (e.g., on top of the insulative material 1202 and between the columns 1304 of dielectric material 1302). The electrically conductive material 1308 may form the upper gates 122 and may comprise, consist of, or consist essentially of a metal (e.g., titanium, tungsten, cobalt, nickel, platinum, and/or ruthenium), a metal composition (e.g., a metal silicide, a metal nitride, and/or a metal carbide), and/or a conductively-doped semiconductor material (e.g., conductively-doped silicon, conductively-doped germanium, and/or conductively-doped gallium arsenide).

The process may include removing (e.g., etching) material between the pillars 102 to form the upper gates 122. In some implementations, the removed material may include the dielectric material 1302 and the electrically conductive material 1308, which may both be removed to form the upper gates 122 at an appropriate height (e.g., to enable operation of upper gates 122). Although the top of each upper gate 122 (shown as electrically conductive material 1308) is shown as being below the bottom of each upper source/drain 104, in some implementations, the top of each upper gate 122 may be above or substantially aligned with the bottom of each upper source/drain 104.

In some implementations, the process may include forming insulative material 1310 between the pillars 102 and on the electrically conductive material 1308 of the upper gates 122 (and on dielectric material 1302 abutting the upper gates 122). The insulative material 1310 may form the upper non-gate region 130 and/or a portion (e.g., a top portion) of the upper gate dielectrics 126a and may comprise, consist of, or consist essentially of one or more of the materials described above in connection with the non-gate region and/or the gate dielectrics 126. For example, the insulative material 1310 may comprise, consist of, or consist essentially of silicon dioxide, among other examples.

In some implementations, the process may include filling the region between pillars 102 and above the height of the upper gates 122 with the insulative material 1310, and then removing (e.g., etching) a portion of the insulative material 1310 to an appropriate height. Although the top of the insulative material 1310 is shown as being substantially aligned with the top of each upper source/drain 104, in some implementations, the top of the insulative material 1310 may be above or below the top of each upper source/drain 104. These example process steps of filling the region between pillars 102 with the insulative material 1310 followed by subsequent etching may be used, for example, when the insulative material 1310 is the same as the dielectric material 1302 (e.g., silicon dioxide).

Alternatively, the process may include removing (e.g., etching) only the electrically conductive material 1308 between the pillars 102 to form the upper gates 122 (rather than removing both the electrically conductive material 1308 and the dielectric material 1302). This may leave the dielectric material 1302 (e.g., along an entire height of the pillars 102). The process may include filling a gap 1312 between the dielectric material 1302 and above the electrically conductive material 1308 with the insulative material 1310 to form the upper non-gate region 130 (e.g., via deposition, or via filling and subsequent removal). These example process steps of removing only the electrically conductive material 1308 and then forming the insulative material 1310 in the gap 1312 may be used, for example, when the insulative material 1310 is different from the dielectric material 1302.

As further shown, the process may include depositing insulative material 1314 between the electrically conductive material 510 and on the insulative material 1310 (or on both the insulative material 1310 and the dielectric material 1302). The insulative material 1314 may form the insulator 136 and may comprise, consist of, or consist essentially of one or more of the materials described above in connection with the insulator 136. For example, the insulative material 1314 may comprise, consist of, or consist essentially of silicon nitride, among other examples.

As further shown, the process may include removing the mask 602 and/or planarizing the upper surface 140 of the integrated assembly. For example, the upper surface 140 may be planarized using chemical-mechanical polishing or another suitable planarization technique. In some implementations, the process may include forming capacitors (not shown), such as capacitors 142, where each capacitor is electrically coupled with a corresponding upper source/drain 104 via a corresponding electrical contact region 138. In some implementations, the process may include forming a memory array that includes the structure 100 (e.g., as part of a memory cell of the memory array).

As indicated above, the process steps described in connection with FIGS. 5A-5B through 13A-13B are provided as examples. Other examples may differ from what is described with respect to FIGS. 5A-5B through 13A-13B.

FIG. 14 is a diagrammatic view of an example memory device 1400 that includes the structure 100. The memory device 1400 may include a memory array 1402 that includes multiple memory cells 1404. A memory cell 1404 is programmable or configurable into a data state of multiple data states (e.g., two or more data states). For example, a memory cell 1404 may be set to a particular data state at a particular time, and the memory cell 1404 may be set to another data state at another time. A data state may correspond to a value stored by the memory cell 1404. The value may be a binary value, such as a binary 0 or a binary 1, or may be a fractional value, such as 0.5, 1.5, or the like. A memory cell 1404 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so son.

Operations such as reading and writing (i.e., cycling) may be performed on memory cells 1404 by activating or selecting the appropriate access line 1406 (shown as access lines AL 1 through AL M) and digit line 1408 (shown as digit lines DL 1 through DL N). An access line 1406 may also be referred to as a "row line" or a "word line," and a digit line 1408 may also be referred to a "column line" or a "bit line." Activating or selecting an access line 1406 or a digit line 1408 may include applying a voltage to the respective line. An access line 1406 and/or a digit line 1408 may comprise, consist of, or consist essentially of a conductive material, such as a metal (e.g., copper, aluminum, gold, titanium, or tungsten), and/or a metal alloy, among other examples. In FIG. 14, each row of memory cells 1404 is connected to a single access line 1406, and each column of memory cells 1404 is connected to a single digit line 1408. By activating one access line 1406 and one digit line 1408 (e.g., applying a voltage to the access line 1406 and digit line 1408), a single memory cell 1404 may be accessed at (e.g., is accessible via) the intersection of the access line 1406 and the digit line 1408. The intersection of the access line 1406 and the digit line 1408 may be called an "address" of a memory cell 1404.

In some implementations, the logic storing device of a memory cell 1404, such as a capacitor, may be electrically isolated from a corresponding digit line 1408 by a selection component, such as a transistor. The access line 1406 may be connected to and may control the selection component. For example, the selection component may be a transistor, and the access line 1406 may be connected to the gate of the transistor. Activating the access line 1406 results in an electrical connection or closed circuit between the capacitor of a memory cell 1404 and a corresponding digit line 1408. The digit line 1408 may then be accessed (e.g., is accessible) to either read from or write to the memory cell 1404.

A row decoder 1410 and a column decoder 1412 may control access to memory cells 1404. For example, the row decoder 1410 may receive a row address from a memory controller 1414 and may activate the appropriate access line 1406 based on the received row address. Similarly, the column decoder 1412 may receive a column address from the memory controller 1414 and may activate the appropriate digit line 1408 based on the column address.

Upon accessing a memory cell 1404, the memory cell 1404 may be read (e.g., sensed) by a sense component 1416 to determine the stored data state of the memory cell 1404. For example, after accessing the memory cell 1404, the capacitor of the memory cell 1404 may discharge onto its corresponding digit line 1408. Discharging the capacitor may be based on biasing, or applying a voltage, to the capacitor. The discharging may induce a change in the voltage of the digit line 1408, which the sense component 1416 may compare to a reference voltage (not shown) to determine the stored data state of the memory cell 1404. For example, if the digit line 1408 has a higher voltage than the reference voltage, then the sense component 1416 may determine that the stored data state of the memory cell 1404 corresponds to a first value, such as a binary 1. Conversely, if the digit line 1408 has a lower voltage than the reference voltage, then the sense component 1416 may determine that the stored data state of the memory cell 1404 corresponds to a second value, such as a binary 0. The detected data state of the memory cell 1404 may then be output (e.g., via the column decoder 1412) to an output component 1418 (e.g., a data buffer). A memory cell 1404 may be written (e.g., set) by activating the appropriate access line 1406 and digit line 1408. The column decoder 1412 may receive data, such as input from input component 1420, to be written to a memory cells 1404. A memory cell 1404 may be written by applying a voltage across the capacitor of the memory cell 1404.

The memory controller 1414 may control the operation (e.g., read, write, re-write, refresh, and/or recovery) of the memory cells 1404 via the row decoder 1410, the column decoder 1412, and/or the sense component 1416. The memory controller 1414 may generate row address signals and column address signals to activate the desired access line 1406 and digit line 1408. The memory controller 1414 may also generate and control various voltages used during the operation of the memory array 1402.

In some implementations, the memory array 1402 may include a memory array and/or integrated assembly described elsewhere herein, such as in connection with FIGS. 1A-1C, 2-4, and/or 5A-5B through 13A-13B. Additionally, or alternatively, the memory cell 1404 may include a memory cell described elsewhere herein, such as the memory cell 202. In some implementations, the memory cell 1404 may include a capacitor and two transistors, as described elsewhere herein. Additionally, or alternatively, an access line 1406 may be the logical access line described elsewhere herein.

As indicated above, FIG. 14 is provided as an example. Other examples may differ from what is described with respect to FIG. 14. For example, although some implementations are described herein in connection with DRAM, some implementations may apply to ferroelectric RAM.

FIG. 15 is a diagrammatic view of an example circuit 1500 of a memory cell 1502 included in the memory device 1400. The memory cell 1502 may correspond to one or more memory cells described elsewhere herein, such as the memory cell 1404 and/or the memory cell 202.

The circuit 1500 includes a memory cell 1502, a logical access line 1504 (shown as LAL, and which may correspond to logical access line 302) that includes a first physical access line 1506 (shown as PAL1 and which may correspond to upper physical access line 304) and a second physical access line 1508 (shown as PAL2, and which may correspond to lower physical access line 306), a digit line 1510 (which may correspond to digit line 144), and a sense component 1512 (which may correspond to sense component 1416).

The memory cell 1502 may include a logic storage component, such as a capacitor 1514, which may correspond to capacitor 142. The capacitor 1514 has a first plate, called a cell plate 1516, and a second plate, called a cell bottom 1518. The cell plate 1516 and the cell bottom 1518 may be capacitively coupled (e.g., via a ferroelectric material positioned between the cell plate 1516 and the cell bottom 1518). The orientation of the cell plate 1516 and the cell bottom 1518 may be flipped without changing the operation of the memory cell 1502. The circuit 1500 also a first transistor 1520 (which may correspond to upper transistor 204) and a second transistor 1522 (which may correspond to lower transistor 206), more generally referred to as a first selection component and a second selection component, respectively. In the example of FIG. 15, the cell plate 1516 may be accessed via plate line 1524, and the cell bottom 1518 may be accessed via the digit line 1510.

The stored data state of the capacitor 1514 may be read or sensed by operating various elements represented in the circuit 1500. The capacitor 1514 may selectively couple with the digit line 1510. For example, the capacitor 1514 can be electrically isolated from the digit line 1510 when either one of the first transistor 1520 or the second transistor 1522 is deactivated, and the capacitor 1514 can be electrically coupled with the digit line 1510 when both the first transistor 1520 and the second transistor 1522 are activated. Activating both the first transistor 1520 and the second transistor 1522 may be referred to as "selecting" memory cell 1502. Thus, a memory cell 1502 may be selectable using the first transistor 1520 and the second transistor 1522.

In some implementations, operation of a transistor is controlled by applying a voltage to the transistor gate, where the voltage magnitude is equal to or greater than the magnitude of the threshold of the transistor. The logical access line 1504 is electrically coupled with the first physical access line 1506, which is electrically coupled with a transistor gate of the first transistor 1520, and the second physical access line 1508, which is electrically coupled with a transistor gate of the second transistor 1522. The logical access line 1504 may activate both the first transistor 1520 and the second transistor 1522. For example, a voltage applied to the logical access line 1504 is applied to the transistor gate of the first transistor 1520 (via the first physical access line 1506) and to the transistor gate of the second transistor 1522 (via the second physical access line 1508), thus connecting the capacitor 1514 with the digit line 1510.

The sense component 1512 may include various transistors and/or amplifiers to detect and/or amplify a difference in signals, which may be referred to as "latching." The sense component 1512 may include one or more sense amplifiers, where one of the sense amplifiers receives and compares the voltage of the digit line 1510 and a reference signal 1526, which may be a reference voltage. The sense component 1512 may then latch the output of the sense amplifier, the voltage of the digit line 1510, or both. The latched data state of the memory cell 1502 may then be output, as described above in connection with FIG. 14.

To write the memory cell 1502, a voltage may be applied across the capacitor 1514. For example, the first transistor 1520 and the second transistor 1522 may be activated via the logical access line 1504 to electrically connect the capacitor 1514 to the digit line 1510. A voltage may then be applied across the capacitor 1514 by controlling the voltage of the cell plate 1516 (via plate line 1524) and/or the cell bottom 1518 (via the digit line 1510) to apply a positive or negative voltage across the capacitor 1514.

As indicated above, FIG. 15 is provided as an example. Other examples may differ from what is described with respect to FIG. 15. For example, although some implementations are described herein in connection with DRAM, some implementations may apply to ferroelectric RAM.

In some implementations, an integrated assembly includes a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction; a first gate proximate to the upper channel, wherein the left-facing vertical surface faces the first gate; a second gate proximate to the lower channel, wherein the left-facing vertical surface faces the second gate; a third gate proximate to the upper channel, wherein the right-facing vertical surface faces the third gate; a fourth gate proximate to the lower channel, wherein the right-facing vertical surface faces the fourth gate; an electrical contact region that is electrically coupled with the upper source/drain; and a digit line that is beneath the pillar and that is electrically coupled with the lower source/drain.

In some implementations, an integrated assembly includes a memory cell that includes: a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction; an upper gate proximate to the upper channel, wherein the right-facing vertical surface faces the upper gate; a lower gate proximate to the lower channel, wherein the left-facing vertical surface faces the lower gate; and a capacitor that is electrically coupled with the upper source/drain; and a digit line that, in combination with the upper gate and the lower gate, is capable of uniquely addressing the memory cell, wherein the digit line is beneath the pillar and is electrically coupled with the lower source/drain.

In some implementations, a memory device includes a plurality of memory cells that each include: a pillar comprising an upper source/drain, a middle source/drain, a lower source/drain, an upper channel between the upper source/drain and the middle source/drain, and a lower channel between the middle source/drain and the lower source/drain; and a gate pair that includes a first gate and a second gate, wherein the first gate is positioned on a first side of the pillar at a first height, and wherein the second gate is positioned on a second side of the pillar, that is opposite the first side, at a second height that is different from the first height; and a capacitor that is electrically coupled with the upper source/drain.

In some implementations, a method includes forming an electrical line; forming a semiconductor material on the electrical line; forming an electrical contact region on the semiconductor material; doping the semiconductor material to form a first doped region, a second doped region, and a third doped region, wherein the first doped region is proximate to the electrical contact region, the third doped region is proximate to the electrical line, and the second doped region is positioned between but separated from the first doped region and the second doped region; forming a first pillar that includes an upper source/drain that is a portion of the first doped region, a middle source/drain that is a portion of the second doped region, a lower source/drain that is a portion of the third doped region, an upper channel between the upper source/drain and the middle source/drain, a lower channel between the middle source/drain and the lower source/drain, a left-facing vertical surface facing a first direction, and a right-facing vertical surface facing a second direction that is opposite the first direction; forming insulative material in a first region between the first pillar and a second pillar and in a second region between the first pillar and a third pillar; forming a lower gate, in the first region, that is separated from the lower channel by the insulative material; forming an upper gate, in the second region, that is separated from the upper channel by the insulative material; and electrically coupling the upper gate and the lower gate.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An integrated assembly, comprising:
a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction;
a first gate proximate to the upper channel, wherein the left-facing vertical surface faces the first gate;
a second gate proximate to the lower channel, wherein the left-facing vertical surface faces the second gate;
a third gate proximate to the upper channel, wherein the right-facing vertical surface faces the third gate;
a fourth gate proximate to the lower channel, wherein the right-facing vertical surface faces the fourth gate;
an electrical contact region that is electrically coupled with the upper source/drain; and
a digit line that is beneath the pillar and that is electrically coupled with the lower source/drain.

2. The integrated assembly of claim 1, wherein the second gate and the third gate are electrically coupled.

3. The integrated assembly of claim 2, wherein the second gate is not electrically coupled with either of the first gate or the fourth gate, and
the third gate is not electrically coupled with either of the first gate or the fourth gate.

4. The integrated assembly of claim 1, further comprising a capacitor that is electrically coupled with the upper source/drain via the electrical contact region.

5. The integrated assembly of claim 4, wherein a first transistor comprises the second gate, the lower source/drain, and the middle source/drain,
a second transistor comprises the third gate, the upper source/drain, and the middle source/drain, and
the first transistor and the second transistor selectively couple the capacitor and the digit line.

6. The integrated assembly of claim 5, wherein the first transistor, the second transistor, and the capacitor are part of a memory cell of a plurality of substantially identical memory cells of a memory array,
the second gate and the third gate form a diagonally opposite gate pair of a plurality of substantially identical diagonally opposite gate pairs of the plurality of substantially identical memory cells,
the digit line is one of a plurality of substantially identical digit lines that extend across the memory array, and
each of the plurality of substantially identical memory cells is uniquely addressed by one of the plurality of substantially identical diagonally opposite gate pairs in combination with one of the plurality of substantially identical digit lines.

7. The integrated assembly of claim 1, wherein the pillar is a first pillar, the upper source/drain is a first upper source/drain, the middle source/drain is a first middle source/drain, the lower source/drain is a first lower source/drain, the upper channel is a first upper channel, the lower channel is a first lower channel, the left-facing vertical surface is a first left-facing vertical surface, and the right-facing vertical surface is a first right-facing vertical surface; and
further comprising:
a second pillar that includes a second upper source/drain, a second middle source/drain, a second lower source/drain, a second upper channel between the second upper source/drain and the second middle source/drain, a second lower channel between the second middle source/drain and the second lower source/drain, a second left-facing vertical surface facing the first direction, and a second right-facing vertical surface that faces the first left-facing vertical surface of the first pillar,
wherein the first gate is proximate to the second upper channel of the second pillar and is in a region between the first pillar and the second pillar, and
wherein the second gate is proximate to the second lower channel of the second pillar and is in the region between the first pillar and the second pillar.

8. The integrated assembly of claim 7, further comprising:
a third pillar that includes a third upper source/drain, a third middle source/drain, a third lower source/drain, a third upper channel between the third upper source/drain and the third middle source/drain, a third lower channel between the third middle source/drain and the third lower source/drain, a third right-facing vertical surface facing the second direction, and a third left-facing vertical surface that faces the first right-facing vertical surface of the first pillar,
wherein the third gate is proximate to the third upper channel of the third pillar and is in a region between the first pillar and the third pillar, and
wherein the fourth gate is proximate to the third lower channel of the third pillar and is in the region between the first pillar and the third pillar.

9. An integrated assembly, comprising:
a memory cell that includes:
a pillar that includes an upper source/drain, a middle source/drain, a lower source/drain, an upper channel between the upper source/drain and the middle source/drain, a lower channel between the middle source/drain and the lower source/drain, a left-facing vertical surface facing a first direction, and a right-facing vertical surface facing a second direction that is opposite the first direction;
an upper gate proximate to the upper channel, wherein the right-facing vertical surface faces the upper gate;
a lower gate proximate to the lower channel, wherein the left-facing vertical surface faces the lower gate; and
a capacitor that is electrically coupled with the upper source/drain;
a digit line that, in combination with the upper gate and the lower gate, is capable of uniquely addressing the memory cell,
wherein the digit line is beneath the pillar and is electrically coupled with the lower source/drain;
an upper physical access line coupled to the upper gate; and
a lower physical access line coupled to the lower gate,
wherein the upper physical access line and the lower physical access line are electrically coupled to form a single logical access line that, in combination with the digit line, is capable of uniquely addressing the memory cell.

10. The integrated assembly of claim 9, wherein the upper gate, the upper source/drain, and the middle source/drain form an upper transistor that is coupled to the single logical access line,
the lower gate, the middle source/drain, and the lower source/drain form a lower transistor that is coupled to the single logical access line, and
the single logical access line selectively couples the capacitor and the digit line.

11. The integrated assembly of claim 9, wherein the upper gate controls a flow of current through the upper channel of the pillar, and
the lower gate controls a flow of current through the lower channel of the pillar.

12. The integrated assembly of claim 9, wherein the memory cell is one of a plurality of substantially identical memory cells of the integrated assembly,
the upper gate and the lower gate form a gate pair of a plurality of substantially identical gate pairs of the plurality of substantially identical memory cells,
the digit line is one of a plurality of substantially identical digit lines that extend through the integrated assembly, and
each of the plurality of substantially identical memory cells is uniquely addressed by one of the plurality of substantially identical gate pairs, that form an access line, in combination with one of the plurality of substantially identical digit lines.

13. The integrated assembly of claim 9, wherein the upper gate is separated from the upper channel by an upper gate dielectric, and
the lower gate is separated from the lower channel by a lower gate dielectric.

14. A memory device, comprising:
a plurality of memory cells that each include:
a pillar comprising an upper source/drain, a middle source/drain, a lower source/drain, an upper channel between the upper source/drain and the middle source/drain, and a lower channel between the middle source/drain and the lower source/drain; and
a gate pair that includes a first gate and a second gate,
wherein the first gate is coupled to a first physical access line and is positioned on a first side of the pillar at a first height,
wherein the second gate is coupled to a second physical access line and is positioned on a second side of the pillar, that is opposite the first side, at a second height that is different from the first height, and
wherein the first physical access line and the second physical access line are electrically coupled to form a single logical access line; and
a capacitor that is electrically coupled with the upper source/drain.

15. The memory device of claim 14, further comprising a plurality of digit lines and a plurality of logical access lines to address the plurality of memory cells,
wherein each logical access line, of the plurality of logical access lines, comprises a corresponding first physical access line, electrically coupled with the first gate of the gate pair, and a corresponding second physical access line electrically coupled with the second gate of the gate pair.

16. The memory device of claim 14, wherein the first height is a height along the pillar that enables the first gate to control a flow of current through the upper channel and between the upper source/drain and the middle source/drain, and
wherein the second height is a height along the pillar that enables the second gate to control a flow of current through the lower channel and between the middle source/drain and the lower source/drain.

17. The memory device of claim 14, wherein each of the plurality of memory cells further includes:
a first transistor that comprises the first gate, the upper source/drain, and the middle source/drain; and
a second transistor that comprises the second gate, the lower source/drain, and the middle source/drain.

18. The memory device of claim 14, wherein the first gate is separated from the upper channel or the lower channel by a first gate dielectric, and
the second gate is separated from the upper channel or the lower channel by a second gate dielectric.

19. The memory device of claim 14, further comprising a plurality of digit lines, wherein the first gate and the second gate, in combination with one another, selectively couple the capacitor and a single digit line of the plurality of digit lines.

20. The memory device of claim 19, wherein the capacitor is electrically coupled with the single digit line when both the first gate and the second gate are activated.

21. The memory device of claim 19, wherein the capacitor is electrically isolated from the single digit line when neither one of the first gate nor the second gate are activated, or if only one of the first gate or the second gate is activated.

22. A method, comprising:
forming an electrical line;
forming a semiconductor material on the electrical line;
forming an electrical contact region on the semiconductor material;
doping the semiconductor material to form a first doped region, a second doped region, and a third doped region,
wherein the first doped region is proximate to the electrical contact region, the third doped region is proximate to the electrical line, and the second doped region is positioned between but separated from the first doped region and the third doped region;

forming a first pillar that includes an upper source/drain that is a portion of the first doped region, a middle source/drain that is a portion of the second doped region, a lower source/drain that is a portion of the third doped region, an upper channel between the upper source/drain and the middle source/drain, a lower channel between the middle source/drain and the lower source/drain, a left-facing vertical surface facing a first direction, and a right-facing vertical surface facing a second direction that is opposite the first direction;

forming insulative material in a first region next to the first pillar and in a second region next to the first pillar;

forming a lower gate, in the first region, that is separated from the lower channel by the insulative material;

forming an upper gate, in the second region, that is separated from the upper channel by the insulative material; and electrically coupling the upper gate and the lower gate by forming an upper physical access line coupled to the upper gate and a lower physical access line coupled to the lower gate, wherein the upper physical access line and the lower physical access line are electrically coupled to form a single logical access line.

23. The method of claim 22, wherein the lower gate is a first lower gate, the upper gate is a first upper gate, and the method further comprises:

forming a second lower gate, in the second region, that is separated from the lower channel by the insulative material; and forming a second upper gate, in the first region, that is separated from the upper channel by the insulative material.

24. The method of claim 22, further comprising forming a capacitor that is electrically coupled with the upper source/drain via the electrical contact region.

25. The method of claim 24, wherein the capacitor, the first pillar, the lower gate, and the upper gate form a memory cell; and wherein the method further comprises forming a memory array that includes a plurality of memory cells that are substantially identical to the memory cell, wherein each memory cell is selectable using a diagonally opposite gate pair that is substantially identical to a gate pair formed by the lower gate and the upper gate.

* * * * *